United States Patent [19]
Ishii et al.

[11] Patent Number: 5,208,497
[45] Date of Patent: May 4, 1993

[54] LINEAR DRIVING APPARATUS

[75] Inventors: Hiroshi Ishii, Kashihara; Hiroyuki Sawai, Nabari; Masaaki Ozaki; Toshiaki Kagawa, both of Tenri, all of Japan

[73] Assignee: Sharp Kabushiki Kaisha, Osaka, Japan

[21] Appl. No.: 509,806

[22] Filed: Apr. 17, 1990

[30] Foreign Application Priority Data

| Apr. 17, 1989 | [JP] | Japan | 1-98601 |
| Oct. 31, 1989 | [JP] | Japan | 1-285380 |
| Dec. 7, 1989 | [JP] | Japan | 1-318678 |
| Jan. 29, 1990 | [JP] | Japan | 2-20208 |
| Jan. 31, 1990 | [JP] | Japan | 2-23273 |
| Jan. 31, 1990 | [JP] | Japan | 2-23274 |

[51] Int. Cl.⁵ .......................................... H02K 41/00
[52] U.S. Cl. ............................... 310/12; 310/51
[58] Field of Search ............................. 310/12, 51

[56] References Cited

U.S. PATENT DOCUMENTS

4,516,231  5/1985  Michaelis ........................ 369/44

FOREIGN PATENT DOCUMENTS

| 0333128 | 9/1989 | European Pat. Off. |
| 0085567 | 5/1982 | Japan ............... 310/51 |
| 63-2997 | 1/1988 | Japan. |
| 2176722 | 1/1987 | United Kingdom. |

OTHER PUBLICATIONS

Patent Abstracts of Japan, vol. 10, No. 34 (P-427) (2091) Feb. 8, 1986, and JP-A-60 182086 (Hitachi Seizakusho K.K.) Sep. 17, 1985, the whole document.

*Primary Examiner*—R. Skudy
*Assistant Examiner*—Judson H. Jones

[57] ABSTRACT

In a linear motor comprises one or more moving units provided to move linearly on a base frame, one or more magnetic field forming members to opposed each of the moving units, and moving means provided on said magnetic forming members for moving the magnetic forming members on the base frame by reaction force occurring when the moving units are driven, whereby vibration acting on the base frame at the time of moving of the linear motor can be cancelled by the motion of the magnetic field forming members.

12 Claims, 20 Drawing Sheets

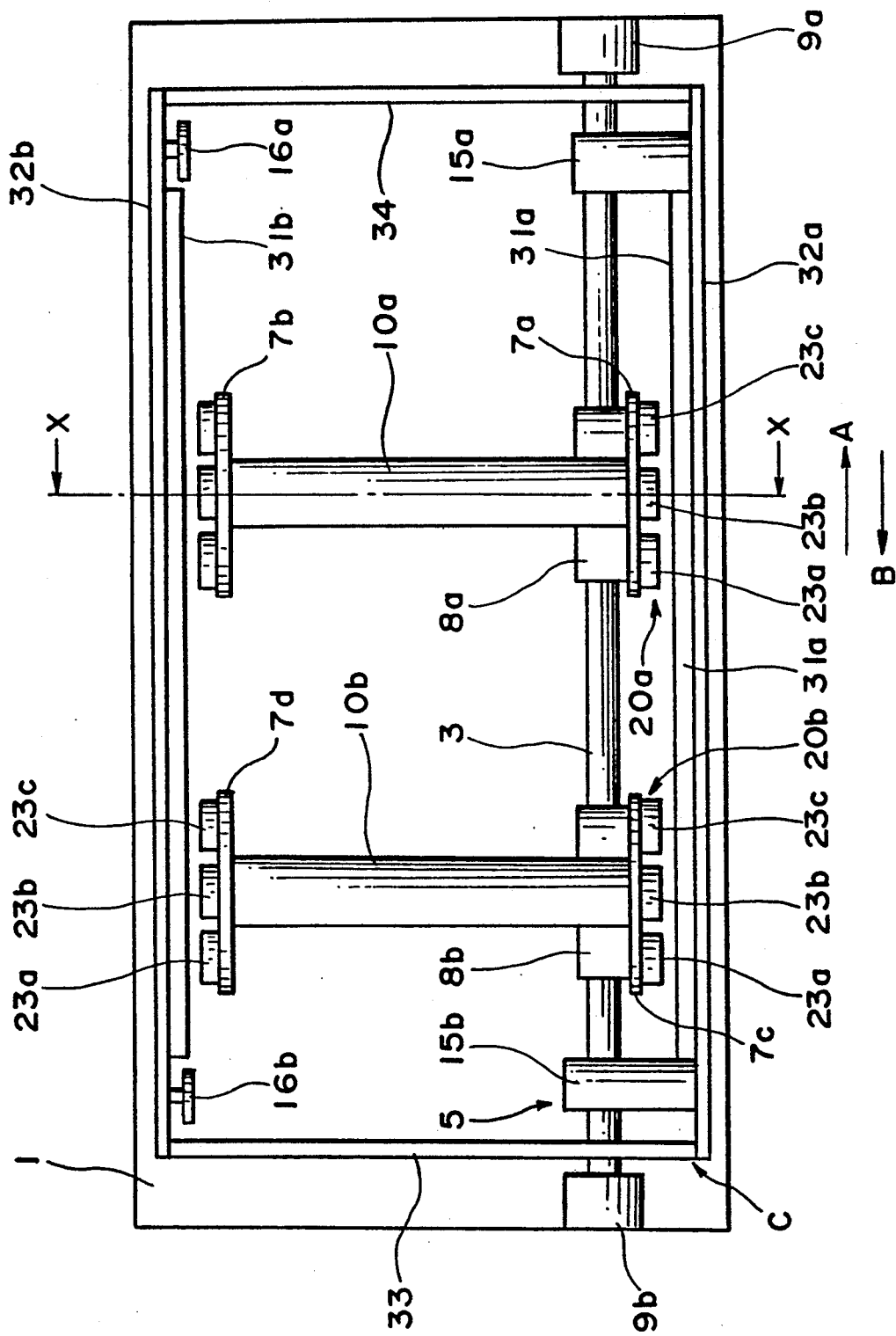

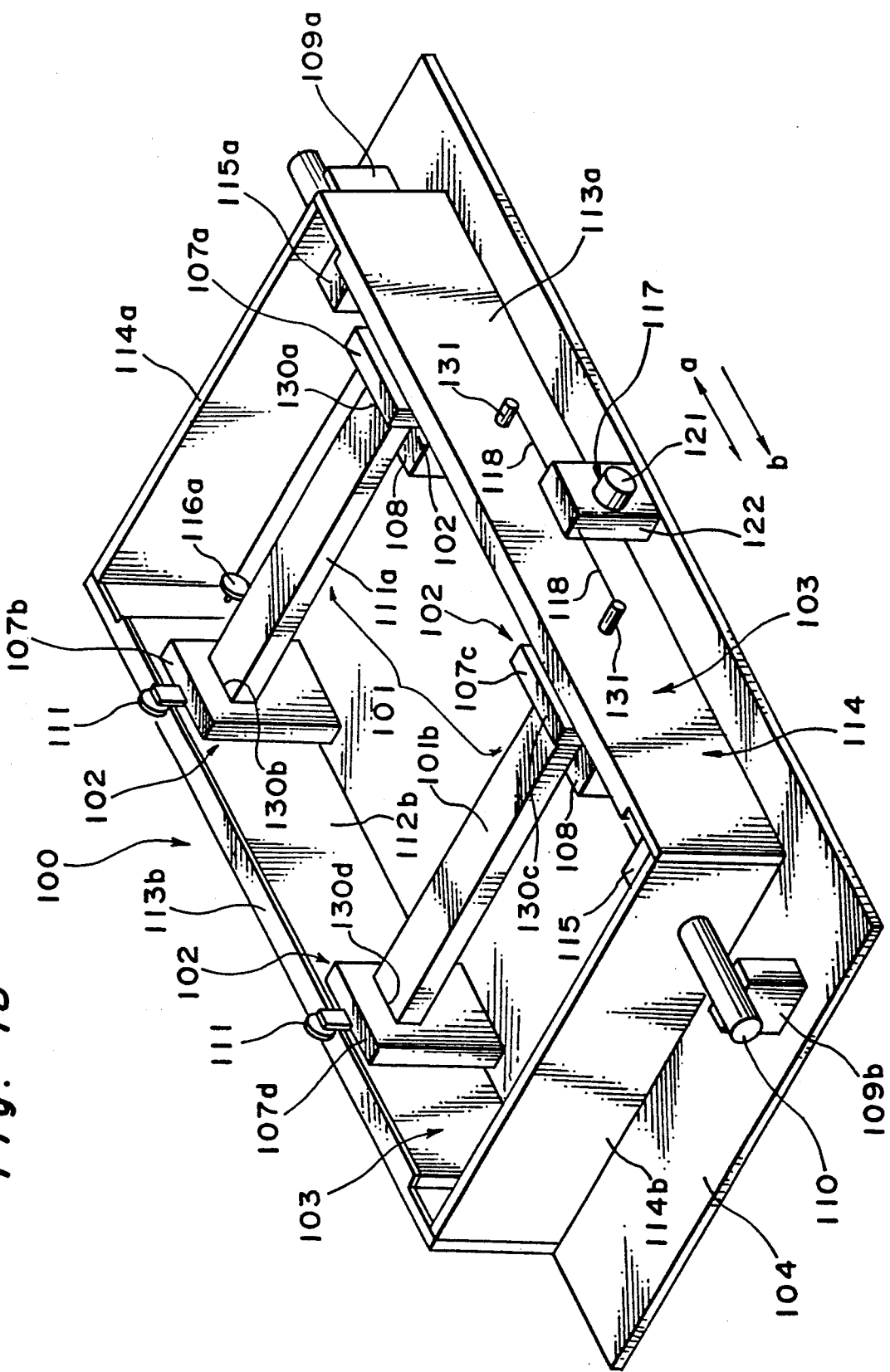

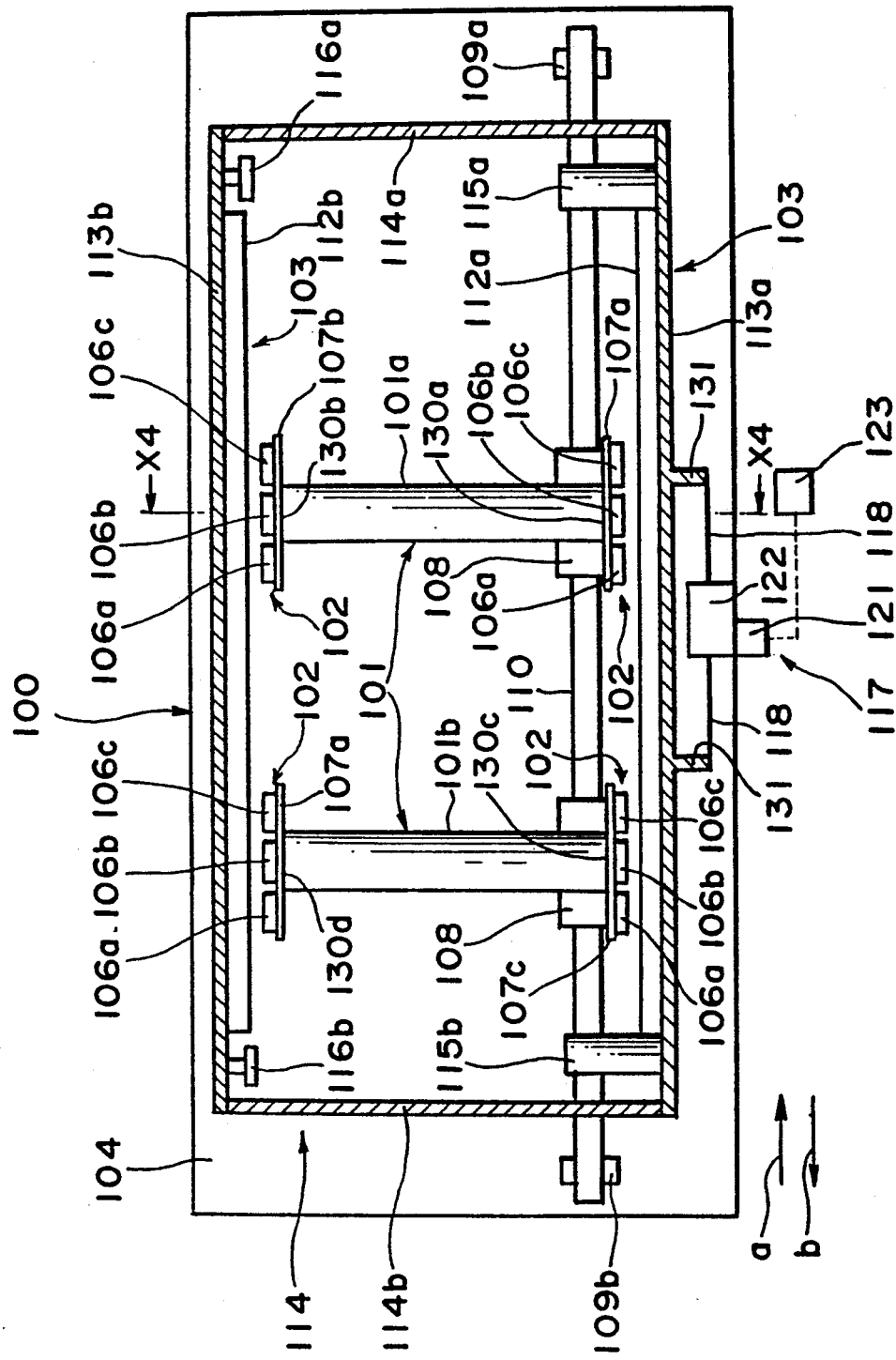

LINEAR DRIVING APPARATUS

BACKGROUND OF THE INVENTION

1. Field of the Invention

The present invention relates to a linear driving apparatus which can be utilized for example for a copying machine, a printer, a magnetic disk apparatus.

2. Description of the Prior Art

FIG. 1a is a schematic drawing of a conventional linear driving apparatus.

In the drawing, the base frame 74 there are provided a movable member 71 on which a moving unit 72 of a magnetic field forming member 73 which are the major components of the linear driving apparatus. The movable member 71 is freely movably disposed on a base frame 74 in the direction of arrow mark F as illustrated in the drawing by a guide shaft (not illustrated). On the other hand, the magnetic field forming member 73 is fixed onto the base frame 74.

When a prescribed exciting current is supplied to coils of the magnetic field forming member 73 under a state where the magnetic fluxes from the magnetic field forming member 73 are crossed, a steering force F is exerted on the moving unit 72 and the movable member 71. Through regulation of the exciting current, the position setting control for the object to be moved (not illustrated) which is connected to the movable member 71 is realized.

However, according to the prior art device as above, the following defects occur.

When an exciting current is supplied to the movable member 71 and a steering force F is exerted, a reaction force Fr (Fr=−F) works on the magnetic field forming member 73 as a counter-effect of the steering force F, which is transmitted to the base frame 74, thereby causing undesirable results such as vibration or deformation of the base frame 74.

The above defect provides a particularly significant problem in the case where the linear driving apparatus is applied to the copying machine or magnetic disk apparatus.

For examples, in the magnetic disk apparatus, data errors occur, while in the high speed copying machine an original document is displaced or the copying machine per se is displaced from the setting position.

FIG. 1c shows another example of the linear driving apparatus which is used for a wafer exposure X-Y stage which is required an accurate positioning control. In the example, the linear driving apparatus is provided on a vibration preventing table 1'' which is situated on a floor 5'' through vibration absorbing members 4''.

In the arrangement mentioned above, the same problem as mentioned in the apparatus shown in FIG. 1a occurs. In addition, with the movement of an object driven by the linear driving apparatus, the vibration preventing table 1'' is slanted by the change of the gravity center of the vibration preventing table 1''.

FIG. 1b is a further example of a conventional linear driving apparatus used in a copying machine in which a RDH 40' (recirculating document handler drum) is provided on the base frame 70 which winds an original document 60' from Da to Db direction. An original plat form 50' is disposed above the copying machine. A guide 720 for linearly moving an original reader 730 made of CCD for reading the original is provided below the RDH drum 40' and the original platform 50'. In order to move the original reader 730, a linear motor 710 which is similar to the linear driving apparatus mentioned above is used. In FIG. 1b, 711 denotes the magnetic field forming member, 712 denotes the moving unit. By the steering force acting on the moving unit 712, the original reader 730 is linearly moved along the guide 720.

In order to copy the original 60' by winding on the RDH drum 40', the content of the original is read by the original reader 730 situated at the position Dc. In making a copy, the original reader 730 is moved to the position Dd by driving the linear motor and by scanning the original again to the De, the original is read.

In the conventional copying machine as mentioned above, the distance of moving the original reader is relatively long, and the moving unit 711 of the linear motor 710 must be long, whereby the above problem becomes an obstacle to reduce the cost of the copying machine. expensive

SUMMARY OF THE INVENTION

The present invention is provided in the light of the above situation. Its object is to provide a linear driving apparatus which is prevented from such undesirable occurrence as vibration or deformation of base even against exertion of a reactive force on the magnetic field forming member.

A further object of the present invention is to provide a linear driving device which is able to present to transmit the vibration or undesired motion of the base frame to other device.

A linear driving device comprising one or more moving units provided to move linearly on a base frame, one or more magnetic field forming members opposed to each of the moving units, and moving means provided on said magnetic forming members for moving the magnetic forming members on the base frame by reaction force occurring when the moving units are driven.

The linear driving apparatus according to the present invention is an apparatus for linearly driving an object to be driven which is connected with a movable element on a base by applying a steering force to the movable element under a magnetic flux from a magnetic field forming member, wherein the magnetic field forming member is freely movable in the direction of inverse steering force, and said moving course is inclined to said base.

BRIEF EXPLANATION OF THE DRAWINGS

FIG. 2 is a plan view of an embodiment of a linear motor device according to the present invention.

FIG. 18 is a perspective view of a further embodiment of the linear driving apparatus according to the present invention, FIG. 19 is a plan view of an embodiment of the linear driving apparatus shown in FIG. 18.

DETAILED DESCRIPTION OF THE PREFERRED EMBODIMENTS

Figure 1A:
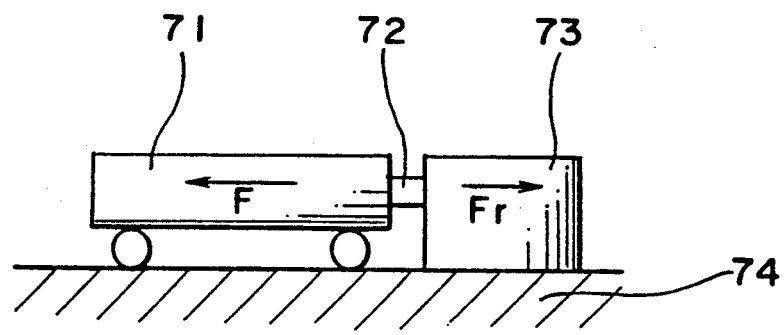
FIGS. 1a and 1c are schematic diagrams showing a principle of motion of conventional linear driving devices.
Figure 1C:
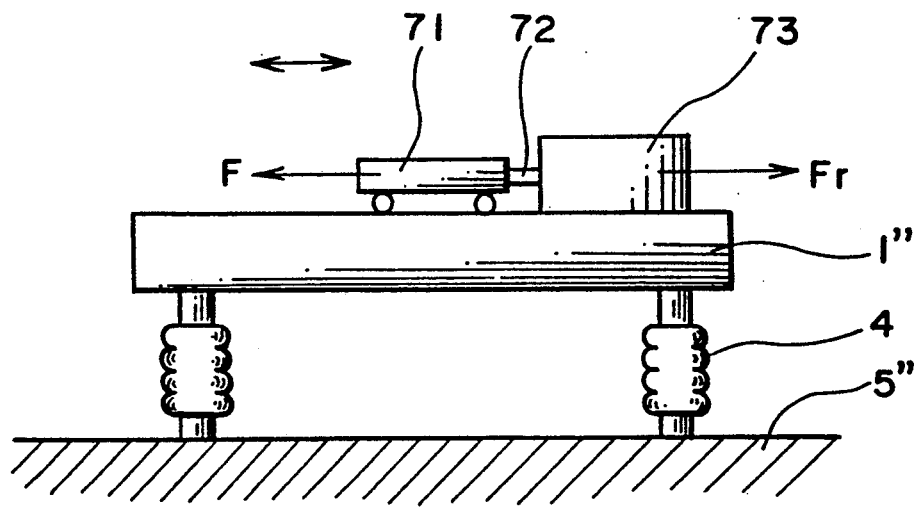
Figure 1B:
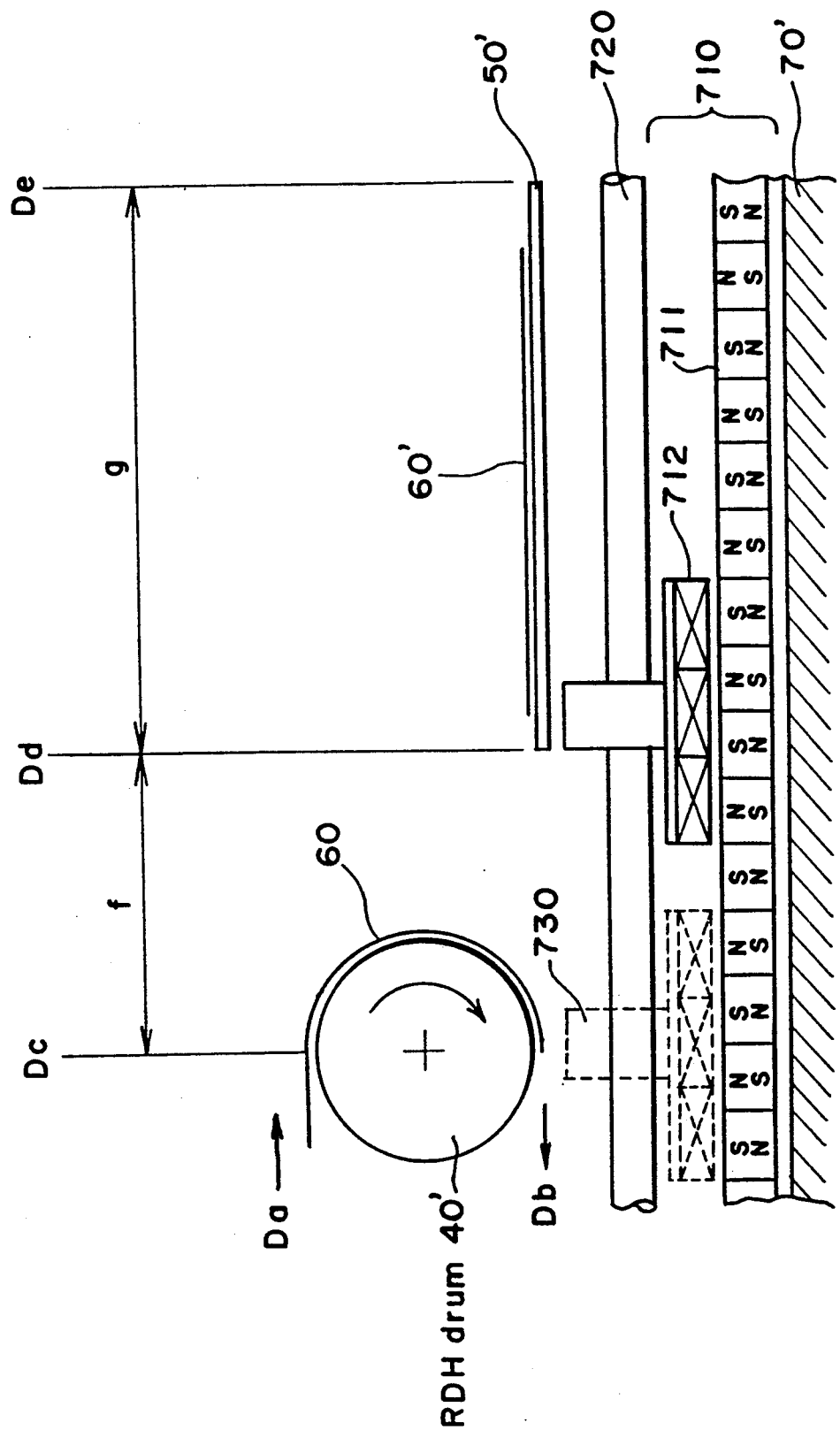
FIG. 1b is a front view of an essential portion of a conventional copying machine using a linear driving apparatus.
Figure 3:
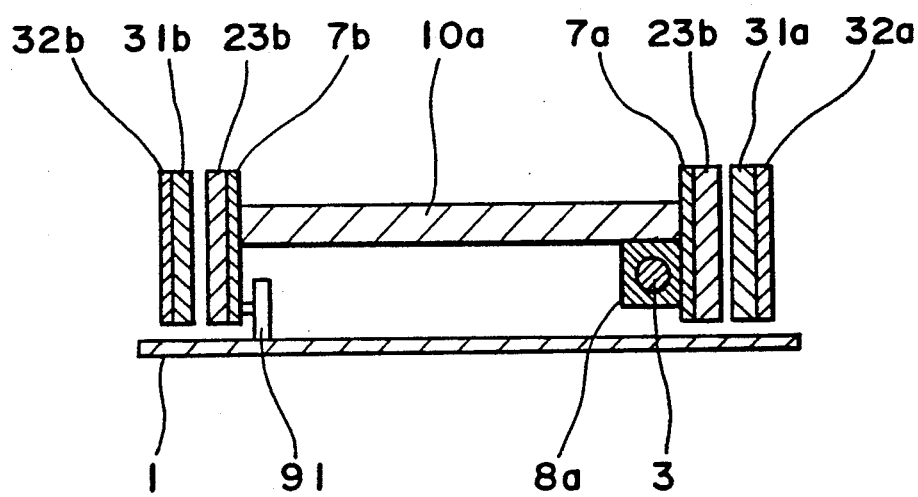
FIG. 3 is a cross sectional view taken along the line X—X in FIG. 2.

In a linear motor device comprising moving units 20a and 20b secured to first and second movable members 10a and 10b provided to move linearly on a base frame 1 and magnetic field forming members 30a and 30b disposed to oppose the movable units 10, there is provided a moving means 5 on the magnetic field forming members 30a and 30b for moving on the base frame 1 in a counter direction of the movement of the movable unit 10 by a reaction force caused by driving the movable unit 10.

The base frame 1 is provided in a copying machine and the first movable member 10a is made of an elongated plate like member such as an optical unit having a 45° mirror and lamp units. The second movable member 10b is formed in the same shape as the first movable unit 10a having a set of rectangular mirrors.

Each of the moving units 20a and 20b comprises three coils 23a, 23b and 23c and a movable yoke 7a (or 7b, 7c and 7d) providing a magnetic field perpendicular to the coils 23a, 23b and 23c. The movable yokes 7a and 7b are secured to the opposite ends of the movable member 10a and the movable yokes 7c and 7d are secured to the opposite ends of the movable members 10b. The coils 23a, 23b and 23c are secured to the outer surface of the movable yokes 7a, 7b, 8c and 7d.

Bearings 8a and 8b for the movable members are secured to the inner surface of the movable yokes 7a and 7c and are slidably supported by a shaft 3 of which both ends are supported to the base frame 1 through holders 9a and 9b.

A moving roller 91 is disposed on the inner surface of each of the yokes 7b and 7d and the mechanism for linear movement of the movable members 10a and 10b are provided by a combination of the rollers 91 and the bearings 8a and 8b supported by the shaft 3.

The magnetic field forming unit is made of permanent magnets 31a and 31b and stator yokes 32a and 32b on which the permanent magnets 31a and 31b are linearly lined up and they are disposed outside the coils 23a to 23c with a predetermined gap so that a three phase linear brushless motor is constructed by the permanent magnets 31a and 31b and the coils 23a to 23c. The stator yokes 32a and 32b have their opposite ends coupled to the connecting plates 33 and 34, thereby to provide a frame member C.

The moving means 5 is composed of a pair of bearings 15a and 15b for the magnetic field formation member which bearings are secured to the stator yokes 32a and 32b and a pair of moving rollers 16a and 16b and both of the moving means 5 are disposed near the connecting plates 33 and 34. The bearings 15a and 15b are movably mounted on the shaft 3 so that the frame C is movable on the base frame 1.

In the arrangement mentioned above, in order to drive the linear motor, the excitation of the coils 23a to 23c are switched corresponding to the outputs of the hole elements (not shown) secured to the yokes 7a, 7b, 7c and 7d and the first movable member 10a and the second movable member 10b are moved with the speed ratio of 2:1 to keep the light path length.

When steering forces Fa(t) and Fb(t) are generated by the moving units 20a and 20b, the movable members 10a and 10b are moved in the scanning direction A, there is generated a reaction force Fr(t) [Fr(t) = −Fa(t)−Fb(t)]. Since the magnetic field forming members 30a and 30b are movable relative to the base frame 1, the magnetic filed forming members 30a and 30b are moved in the direction B opposite to the direction of the movement of the movable members 10a and 10b, whereby the reaction force Fr(t) is not transmitted to the base frame 1.

In case of returning operation, the movable members 10a and 10b are moved in the direction B, the magnetic field forming members 30a and 30b are moved in the scanning direction by reaction force, returning to the home position.

Figure 4:
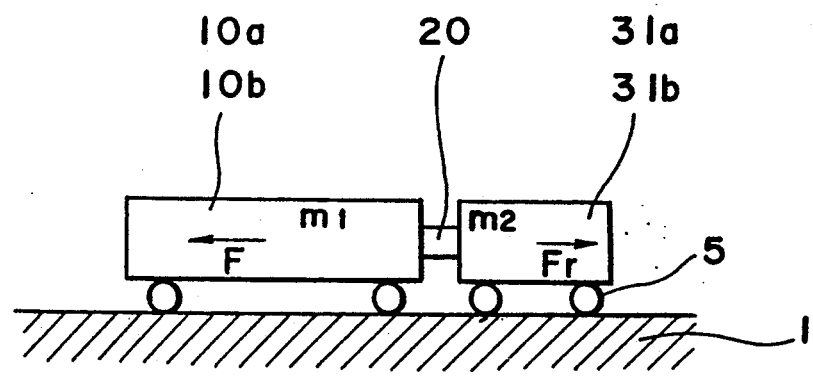
FIG. 4 is a schematic diagram showing a principle of motion of the linear motor device shown in FIG. 2, FIG. 5 are graphs showing the motion of the linear motor device according to the present invention.
Figure 5:
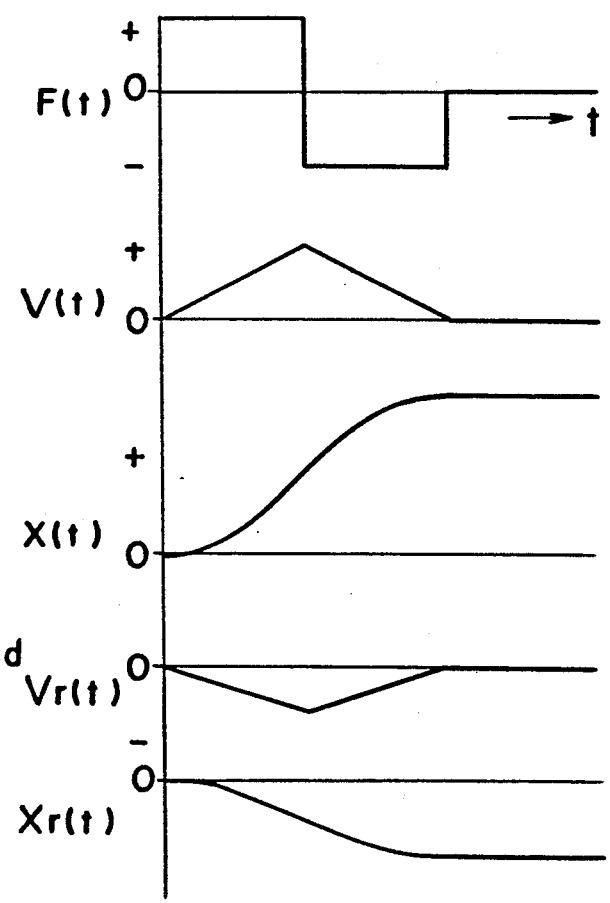

The arrangement shown in FIG. 2 can be expressed as FIG. 4. Assuming that the mass of the movable member 10a and the moving unit 20a is m1a with its speed Va(t) and the amount of its displacement Xa(t) and steering force Fa(t), and that the mass of the movable member 10b and the moving unit 20b is m1b with its speed Vb(t) and the amount of its displacement Xb(t) and steering force Fb(t), and that the mass of the magnetic field forming members 30 is m3 with its speed Vr(t) and the amount of its displacement Xr(t) and steering force Fr(t), the following equations can be established.

$$Fr(t) = -(Fa(t) + Fb(t))$$

$$Va(t) = 1/m_a \int Fa(t)dt$$

$$Xa(t) = 1/m_{1a} \int \int Fa(t)dt$$

$$Vb(t) = 1/m_{1b} \int Fb(t)dt$$

$$Xb(t) = 1/m_{1b} \int \int Fb(t)dt$$

$$Xr(t) = 1/m_3 \int \int Fr(t)dt$$

$$\therefore Xr(t) = -(m_{1a}/m_3 Xa(t) + m_{1b}/m_3 Xb(t))$$

Accordingly, by providing the magnetic field forming members to move on the base frame 1, it is possible to absorb the reaction force acting to the magnetic magnetic field forming members by the movement of the magnetic field forming members and to prevent undesired transmission of the force to the base frame 1. Therefore, it is possible to suppress vibration of the base frame.

SECOND EXAMPLE

Figure 6:
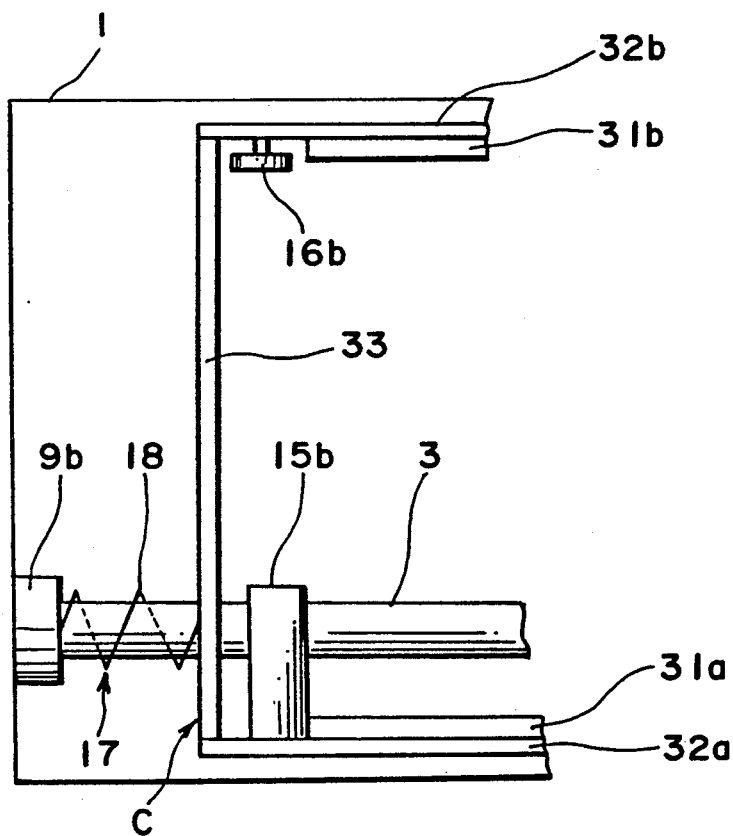
FIGS. 6 and 7 are plan views showing essential portions of further embodiments.

Referring to FIG. 6 showing the second example of the linear motor device according to the present invention which is suitable to prevent displacement of the returned position of the magnetic field forming members and there is provided a retracting unit 17 for retracting the magnetic field forming members to the home position. The retracting unit 17 comprises a coil spring 18 mounted on the shaft 3, having its one end secured to the holder 9b and another end secured to the connecting plate 33. In the arrangement mentioned above, when the magnetic field forming member 30 is situated at the correct home position, the coil spring 18 is placed in the neutral condition. Other structure is the same as shown in FIG. 2.

Upon scanning movement of the movable members 10a and 10b, the magnetic field forming members 30a and 30b are moved in the counter direction by the moving means 5. Upon returning movement of the movable members 10a and 10b, the magnetic field forming members returns to the home position. When the scanning and returning are repeated, the home position of the magnetic field forming member may be displaced because of the friction between the bearings 15a and 15b and the shaft 3, the friction between the rollers 16a and 16b and the base frame 1. If such displacement occurs, the coil spring 18 is expanded or shrunk, whereby the magnetic field forming members are moved to the correct home position by the force of the coil spring 18.

There may be provided another coil spring 18 between the holder 9a and the connecting plate 34.

By returning the magnetic field forming members to the correct position, it is possible to maintain the opposing position of the permanent magnets 31a and 31b and the coils 23a, 23b and 23c stable, whereby the operation of the linear motor can be stabled.

THIRD EXAMPLE

Figure 7:
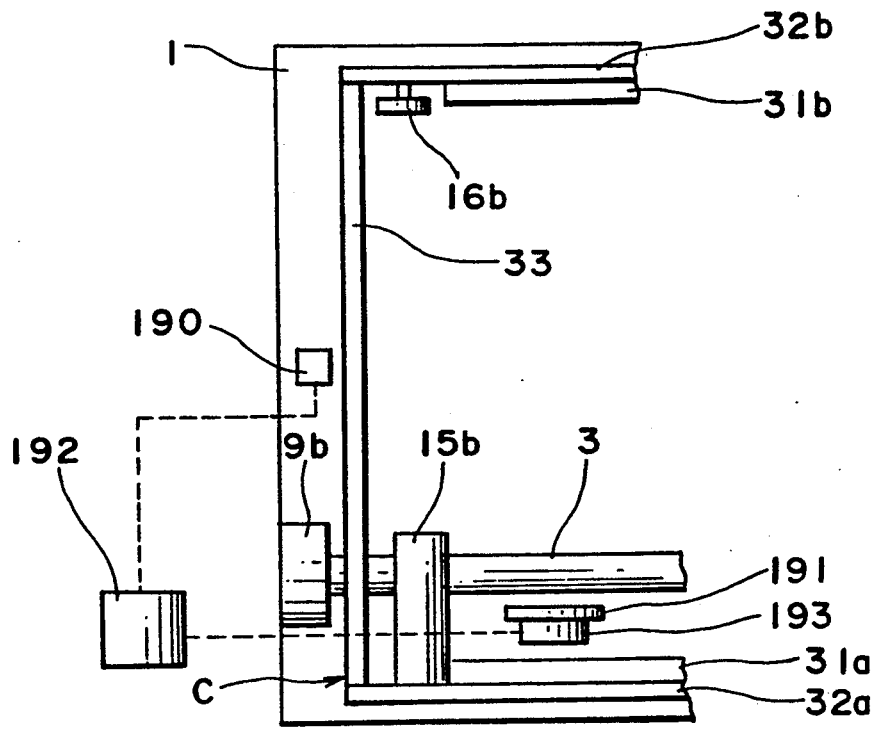

Referring to FIG. 7 showing the third example, the retracting unit 17 is comprised of a displacement detector 190 for detecting the displacement of the stator yoke 32, a micromotion coil 191 which is servo-controlled by the output of the displacement detector 190 and a control unit 192 having a microcomputer for servo-controlling the coil 191 receiving the output of the detector 190. As the displacement detector 190, a conventional optical distance sensor or ultrasonic distance sensor are used. The detector 190 is situated on the base frame 1 outside the connecting plate 33. The micromotion coil 191 is secured to a fixed yoke 193 for the micromotion and secured to the base frame 1 so as to be situated to oppose to the permanent magnet 31a between the yoke 32a and the shaft 3. When the scanning and returning are repeated, the home position of the magnetic field forming member may be displaced because of the friction between the bearings 15a and 15b and the shaft 3, the friction between the rollers 16a and 16b and the base frame 1. If such displacement occurs, the displacement is detected by the displacement detector 190. The control unit 192 drives the coil 191 by the output of the detector 190 as the feed back signal so that the magnetic field forming members are moved by the coil 191 to retract at the correct home position.

In the arrangement mentioned above, there may be used various modifications, For example, the moving unit 20a and 20b and the magnetic field forming members 30a and 30b may be moved along one or more rails provided on the base frame 1 in place of moving them along the shaft 3.

As mentioned above, in the embodiments mentioned above, since the moving means is provided on the magnetic field forming members to move the magnetic forming member on the base frame in a direction opposite to the motion of the moving unit, the reaction force occurring on the magnetic field forming members can be absorbed by the motion of the magnetic forming members, the transmission of the vibration to the base frame can be prevented.

The linear driving apparatus shown here is one equipped on a slit exposure type copying machine, which has a basic construction that, on the base frame 1 inside the body (corresponding to the base) the first movable member 10a and the second movable member 10b or the objects to be moved are alternately linearly driven in the direction A which is the scanning direction and in the direction B which is returning direction at a velocity ratio of 2 to 1.

On the first movable member 10a there are loaded optical units such as a 45° mirror, an exposure lamp unit, etc., and on the second movable member 10b other optical units such as an orthogonal mirror, respectively. These are all omitted from illustration.

Figure 9:
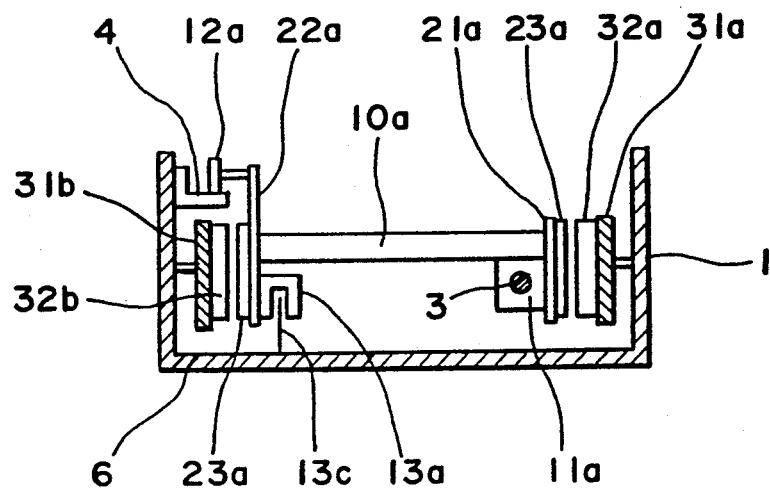
FIG. 9 is a sectional view taken along the line X2—X2 in FIG. 8.

On the base frame 1, the shaft 3 disposed to the directions A and B is fitted through holders 2. The shaft 3 is horizontally arranged to the base frame 1. On the lateral side of the anti-shaft side of the base frame, a rail 4 (ref. FIG. 9) is fitted in the same direction as the shaft 3.

At the lower end sides of the first movable member 10a and the second movable member 10b, there are provided the bearings 11a and 11b which are in pair with the shaft 3. On the other hand, at the other end side of the upper part of the second movable member 10b there are provided the rollers 12a, 12b (not illustrated) which rotate on the rail 4 (ref. FIG. 9).

That is to say, the first movable member 10a and the second movable member 10b are freely movable, independently from each other, in the directions A and B by means of the shaft 3 or the like. Also, in consideration of the positional relation with the shaft, the other end sides of the first movable member 10a and the second movable member 10b are given, respectively, by the rollers 12a and 12b.

Further, there are provided, at the opposite ends of the first movable member 10a, the moving unit 20a, and at the opposite ends of the second movable member 10b the moving unit 20b, respectively.

Detailed description is given on the moving unit 20a. This has a structure wherein the three phase coil 23a is fitted to the yoke 21a (or the yoke 22a). Further, though not illustrated, at the central part of the three phase coil 23a, there is provided a hole element for detecting the magnetic electrode of the magnetic field forming member 30a (or 30b) which will be described later. Further, on the upper part of the yoke 12a, there is fixed the above described roller 12a as shown in FIG. 9, and on the lower part thereof there is fixed a moving unit 20a, or in other words, a linear encoder 13a for detecting the moving position of the first movable member 10a.

Figure 8:
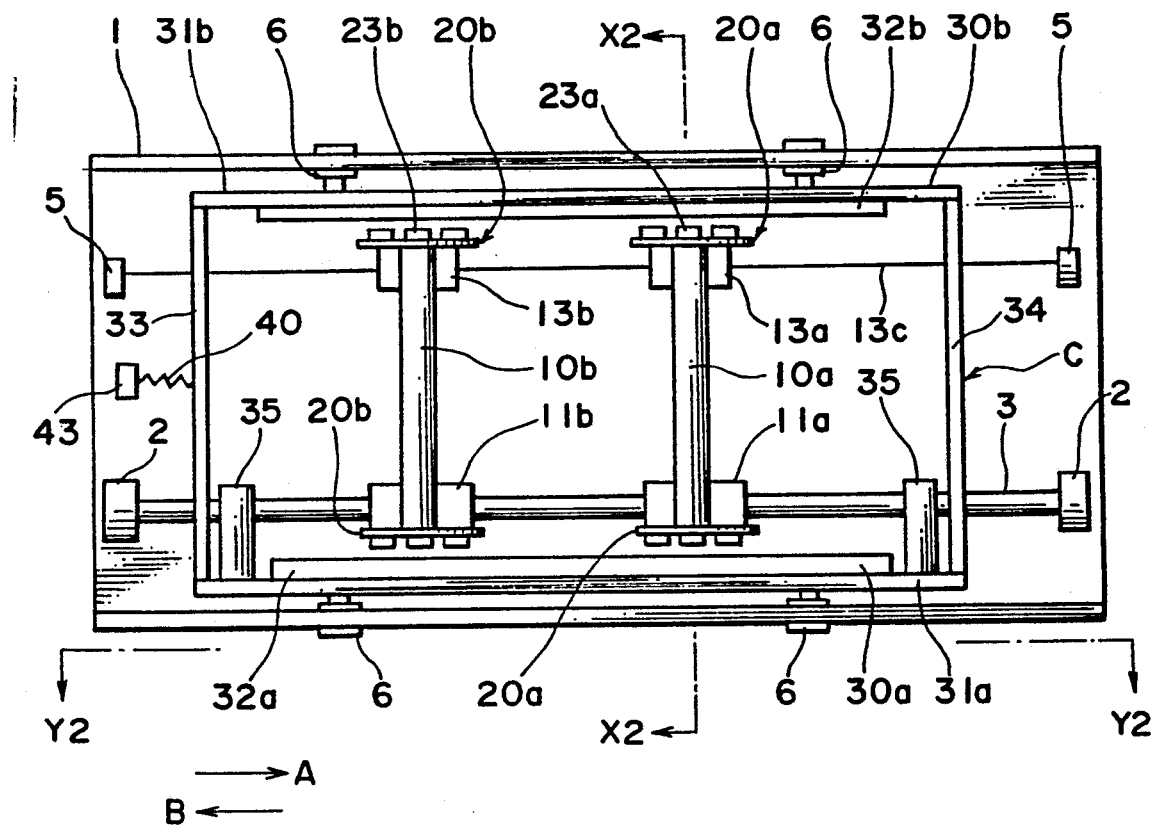
FIG. 8 is a plan view of a further embodiment of the linear driving apparatus according to the present invention.

The stator scale 13c which is in pair with the linear encoder 13a is fixed onto the base frame 1 through a fixing member 5, as shown in FIG. 8.

On the other hand, with respect to the moving unit 20b, explanation is omitted because the structure is entirely the same, as to the linear encoder 13b, the stator scale 13c is used together.

Next, explanation is given on the magnetic field forming members 30a and 30b.

The magnetic field forming member 30a has a construction wherein a plurality of permanent magnets 31a are alternately magnetized with N-pole and S-pole on the stator yoke 32a which is an elongated metal plate.

On the other hand, with respect to the magnetic field forming member 30b, explanation is omitted because it has the entirely same construction as the magnetic field forming member 30a. The two members are connected with each other at both ends by means of the connecting plates 33 and 34, by which there is formed a frame comprising a magnetic field forming member 30a, a connecting plate 33, a magnetic field forming member 30b, and a connecting plate 34.

It is to be added that the linear motor a is constituted by the above mentioned moving unit 20a and the magnetic field forming members 30a, 30b, and on the other hand the linear motor b is constituted by the moving unit 20b and the magnetic field forming members 30a and 30b, and these two motors are independently controlled under the linear motor control circuit 50 to be described later.

Through the above mentioned frame C, the shaft 3 is thrusted from the directions A and B, so that the frame C is freely movable along the shaft 3 by a specified amount. Further, in the internal part of the frame C, the first movable member 10a and the second movable member 10b are freely movable, so as that a constant gap length is maintained between the movable members 20a, 20b and the magnetic field forming members 30a, 30b at any position whatsoever.

On the base frame 1, a spring 40 is provided through a fixing member 43, so that the extremity of the spring 40 comes into contact with the surface of the connection plate 33 of the frame.

To explain the state in more detail, on the inner surface of the magnetic field forming member 30a there are provided two bearings 35, each in pair with the shaft 3. The bearings 35, being different from the bearings 11a or 11b, are provided to regulate the movements of the frame C in the directions A, B and Y in the drawing. If it is assumed that there is no roller 6 to be described later, the frame is movable in vertical direction (direction of specific gravity) by a specified amount.

On the faces of the connection plates 33, 34, there are formed the holes through which the shaft 3 is led. The diameter of these holes is set to be larger than that of the shaft 3.

Figure 10:
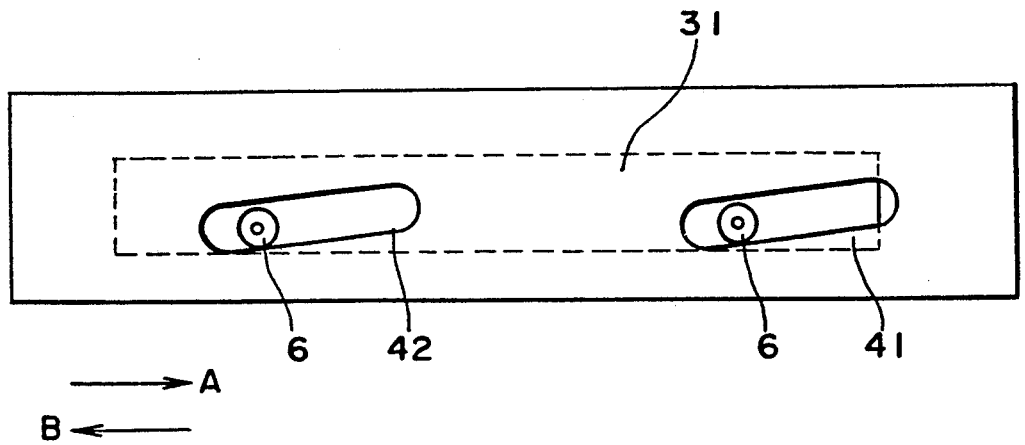
FIG. 10 is a perspective view taken along the line Y2—Y2 in FIG. 8.

On the reverse faces of the magnetic field forming members 30a, 30b corresponding to the two lateral sides of the frame C, there are provided two rollers which support the frame body. These rollers 6 are allowed to slide along the slot 42 formed on the lateral side of the base frame 1, as shown in FIG. 10. This slot 42 is set to be larger than the roller 6, with an angle provided to the base frame 1, the direction B being underneath.

In other words, the frame C is restricted to move in the directions A and B by the shaft 3, but this moving course is set to be oblique to the base frame 1, in other words, in the direction of the slot 42. Accordingly, in order for the frame C to move in the direction A from the initial position shown in FIG. 10, a certain external force is required to be exerted to it. However, when the effect of this external force is lost, the frame C naturally moves in the direction B under the component of force in the direction of the slot 42 of the specific gravity which acts on the frame C. And, the spring 40 gets in contact with the surface of the connection plate 33 of the frame C, by which the frame C is automatically returned to the original initial position. The spring 40 is provided so as to prevent the occurrence such that the frame C moves in the direction B to bring the roller 6 into contact with the edge of the slot 42 in the direction A in a large impact force.

The intensity of the component of force of the specific gravity working on the frame C in the direction of the slot 42 is set by taking into account the variation of the sliding load of the frame C to the base frame 1, etc.

Figure 11:
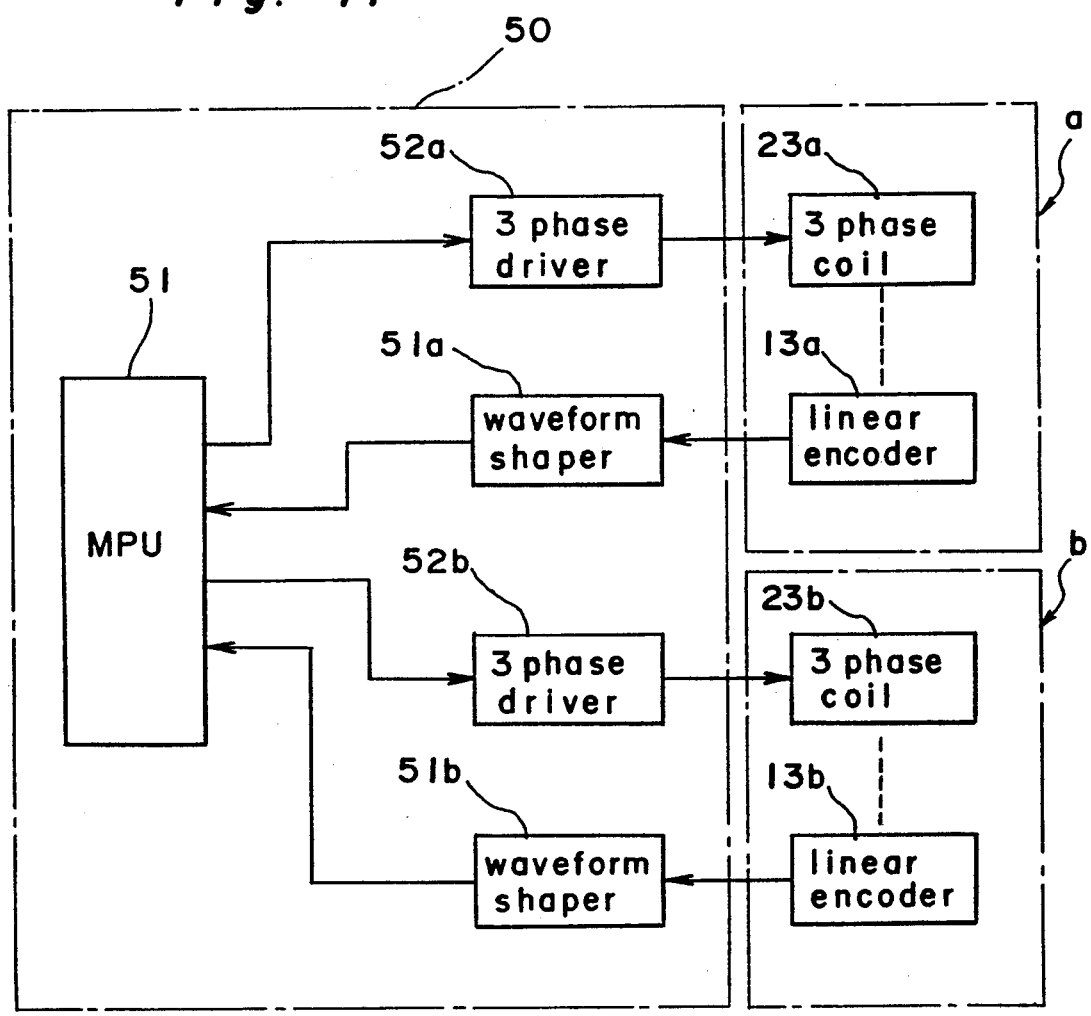
FIG. 11 is a block diagram showing an electric circuit arrangement of the linear driving apparatus used in the embodiment shown in FIG. 8.

Next, the linear motor control circuit 50 is explained with reference to FIG. 11.

The position detection signal of the linear encoder 13a comprises the phase A and phase B signals each having the phase difference 90° and the Z signal for detecting the original point, and is led to a microprocessor MPU 51 mediated by a waveform shaper 51a, by which the data of the moving position of the first movable member 10a are sequentially introduced into MPU 51.

In MPU 51, the data of the speed pattern of the first movable member 10a are previously inputted, so that these data are sequentially read out and compared with the data of the above moving position, and the results of the comparison are sequentially outputted to the three phase driver 52a. In this three phase driver 52a there is a circuit construction to form the current proportionate to the signal from MPU 51, and the current is supplied to the three phase coils 23a, respectively.

The above matter deals with the explanation on the linear motor a, but as the state is entirely same as with respect to the linear motor b, explanation is omitted.

Accordingly, the linear motor control circuit 50 is made to use each output of the linear encoders 13a and 13b as a feedback signal to adjust the steering forces generated on the linear motors a and b, respectively, and the first movable member 10a and the second movable member 10b are independently subjected to speed control by closed loop.

Figure 12:
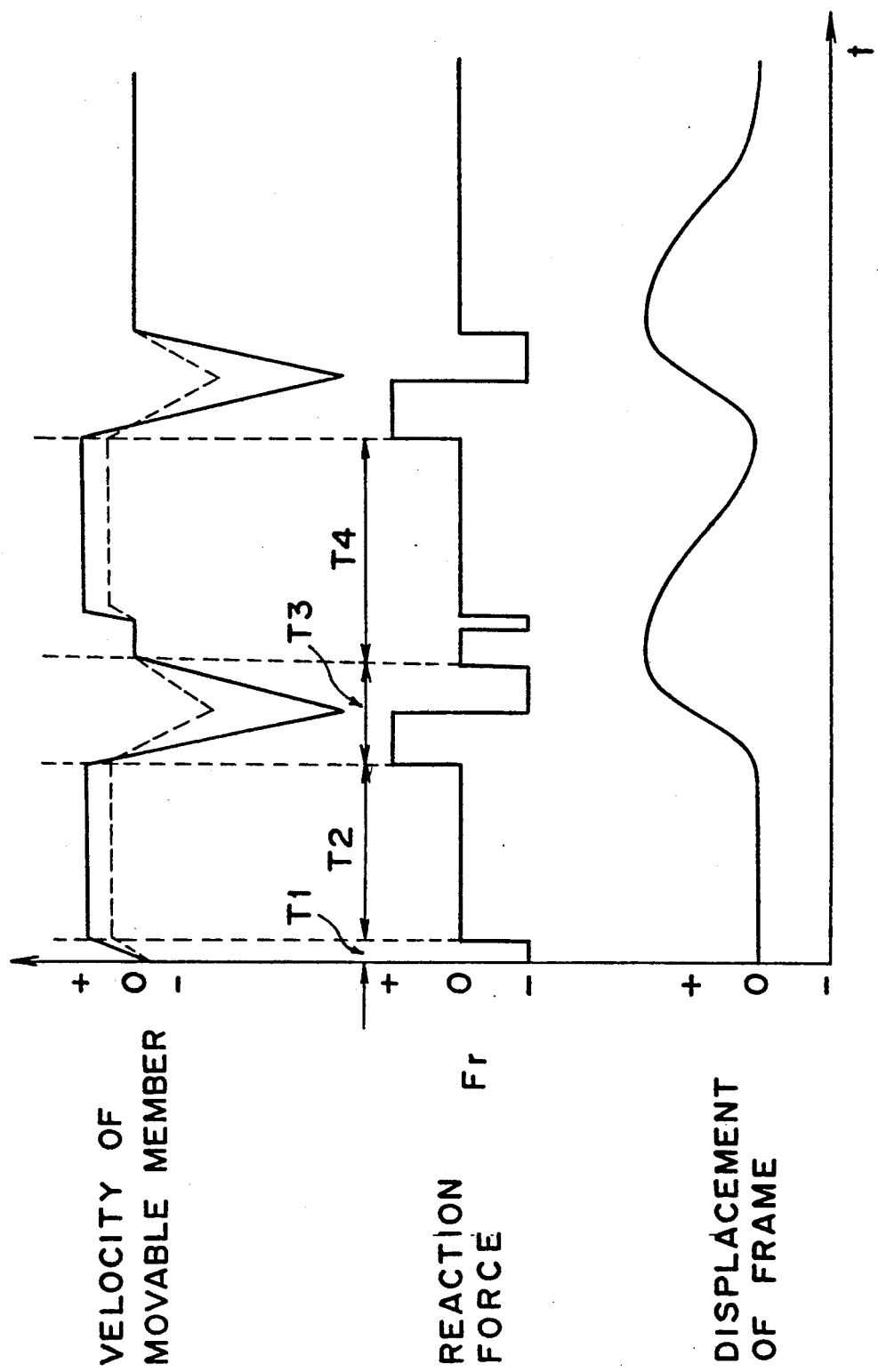
FIG. 12 is a graph showing the relationship between the velocity of the movable member and the reaction force working on the frame and the displacement of the frame.

By the linear driving apparatus constructed as above, the first movable member 10a and the second movable member 10b are subjected to speed control by the speed patterns as shown in the upper column in FIG. 12.

Here, when the steering forces Fa(t) and Fb(t) are generated on the linear motors a and b, a reactive force Fr [=−Fa(t)−Fb(t)] is acted on the frame C as a reaction of the steering force F. The middle column in FIG. 12 shows the intensity of the reactive force Fr acting on the frame C, and the lower column in FIG. 12 a displacement of the frame C from the initial position.

To explain the state in detail below, in the period T1, the first movable member 10a and the second movable member 10b move in the scan direction (direction A) by the steering force F. Then, by the reactive force Fr, the frame C slightly moves in the direction B, but immediately returns to the original home position by the recovery force of the spring 40.

In the period T2, since the first movable member 10a and the second movable member 10b are of constant speed movement, no reaction force Fr acts on the frame C, so that the frame C remains at the initial position.

In the period T3, by the steering force F working in the reverse direction to the above, the first movable member 10a and the second movable member 10b are rapidly returned in the return direction (direction B), after which, on reversing the direction of the steering force F, the first movable member 10a and the second movable member 10b are again rapidly returned in the feed or scanning direction (direction A).

When the first movable member 10a and the second movable member 10b are rapidly returned in the return direction (direction B) and the reaction force Fr acts on the frame C, the frame C moves in the feed direction (direction A) to show large displacement from the initial position. In the subsequent period T4, the entirely same movements take place as those in the period T1 and T2, but the effect of the position displacement in the period T3 still remains.

However, according to the linear drive apparatus of the present invention, this position displacement can be eliminated with the lapse of time. That is to say, when the frame C moves in the scanning direction (direction A), by the component of force in the direction of the slot 42 of the specific gravity acting on the frame C, the frame C naturally tends to move in the return direction (direction B).

Further, the reaction force Fr working on the frame C in the period T3 is not transmitted to the base frame 1 due to the movement of the frame C, so that undesired condition such as vibration or deformation of the base frame 1 occurs.

However, although the reaction force Fr which works on the frame C when the second movable member 10b moves in the scanning direction (direction A) is transmitted to the base frame 1 via the spring 40, the energy of the reaction force in this case is far smaller than that of the case of the period T3 and is practically negligible.

Accordingly, according to the linear driving apparatus of the present invention even when the first movable member 10a and the second movable member 10b show linear movements by the speed pattern as shown in the upper column of FIG. 12, no vibration occurs on the body of the apparatus, and the displacement of the frame C is also negligible. Moreover, in returning the frame C to the initial position, no fresh motive power source is necessitated but a slight change in design may suffice to cover the purpose. Accordingly, the present invention system is very practical in costwise aspect, and makes it possible to provide a high performance, low cost copying machine.

The linear driving apparatus of the present invention is applicable not only for a copying machine but also as a printer, a magnetic disk apparatus or the like.

As described above, according to the linear driving apparatus of the embodiment, even when a reaction force is worked on the magnetic field forming member as a reactive effect to the steering force working on the movable member, no reaction force is transmitted to the base and no undesirable vibration or deformation of base frame occurs, because the magnetic field forming member is freely linearly movable in the counter-steering force direction. On the other hand, due to the freely movable state of the magnetic field forming member, there arises afresh a problem of displacement of the position of the magnetic field forming member. However, as the moving course of the magnetic field forming member is inclined to the base frame, the magnetic field forming member naturally returns to its normal position by its own weight without exertion of any external force.

Figure 13:
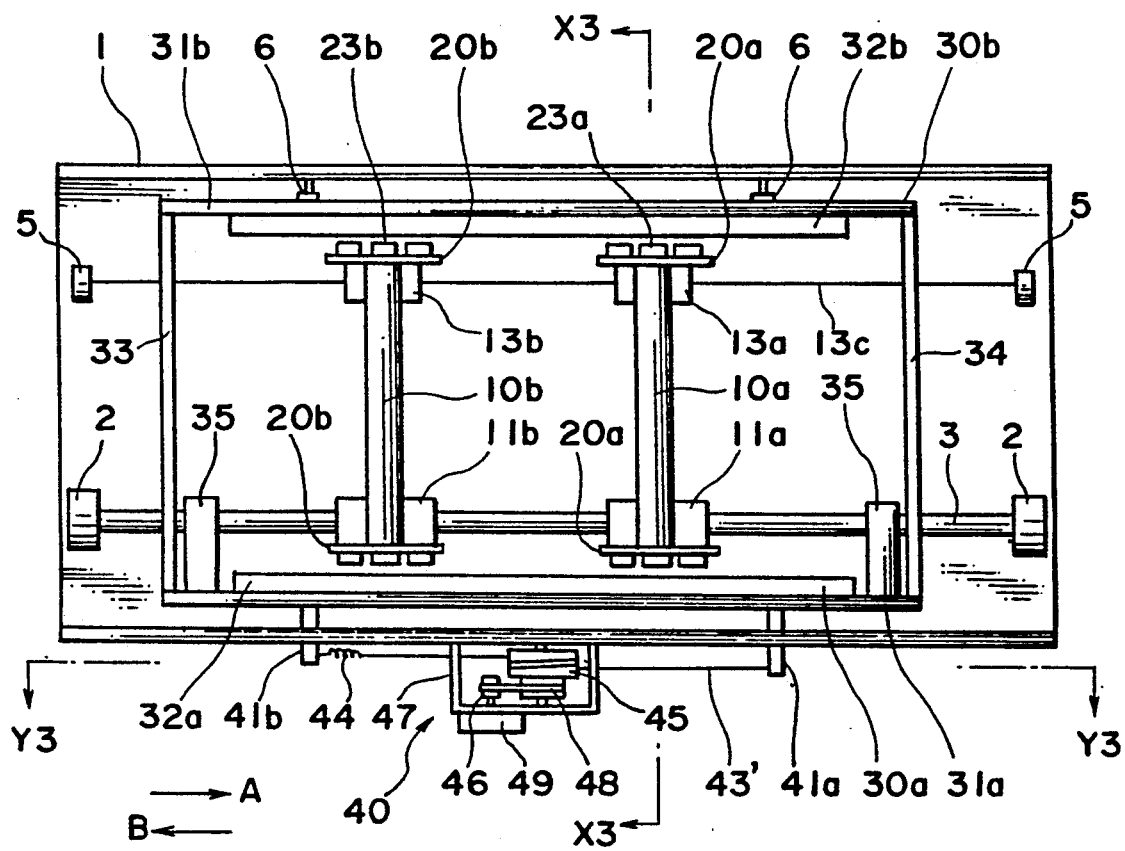
FIG. 13 is a plan view showing a further embodiment of the linear driving apparatus according to the present invention.
Figure 14:
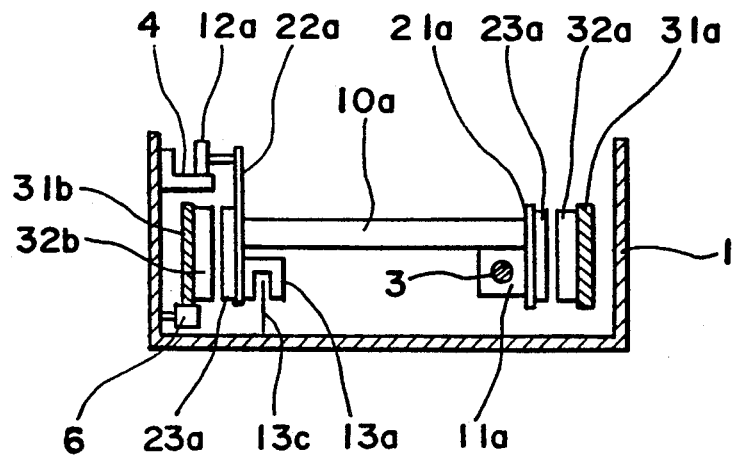
FIG. 14 is a cross sectional view taken along the lines X3—X3 in FIG. 13.
Figure 15:
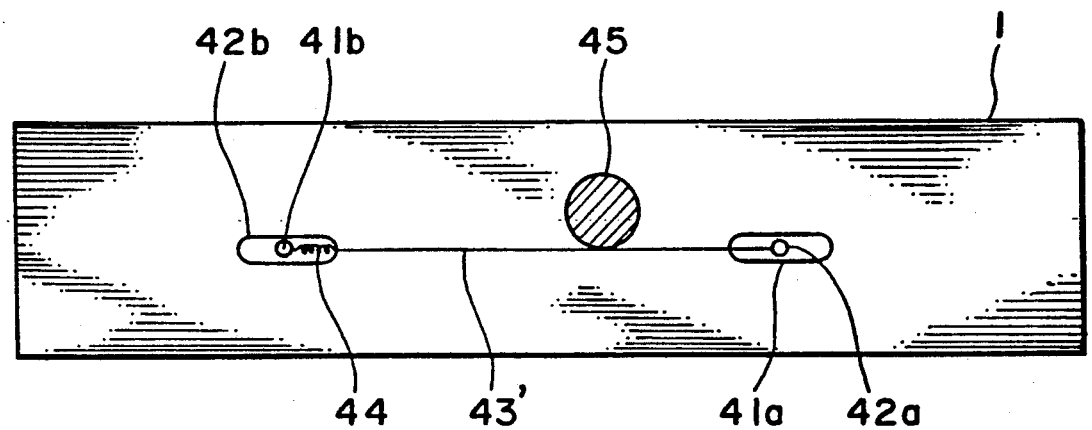
FIG. 15 is a cross sectional view taken along the line Y3—Y3 in FIG. 13.

Referring to FIGS. 13 and 14 showing a further example of the retracting unit 17, there are provided supporting shafts 41a and 41b to project outwardly from the yoke 31a. The supporting shafts 41a and 41b are adapted to project outside the base frame 1 through the openings 42a and 42b defined on both sides of the base frame 1 (see FIG. 15). Between the openings 41a and 41b, a pulley 45 is rotatably suspended on a wire 43 suspended on the free ends of the supporting shafts 41a and 41b. The pulley 45 is supported along with a timing pulley 46 in a gear box 47 situated outside the base frame 1 and the pulley 45 and the timing pulley 46 are coupled by a timing belt 48. Outside the gear box 47, there is provided a pulse motor 49 of which output shaft is coupled to the timing pulley 46.

In the arrangement mentioned above, when the pulse motor 49 is driven, and the timing pulley 45 is rotated alternately, the pulley 45 is alternately rotated with a decreased speed through the timing belt 48, whereby the magnetic field forming members 30a and 30b are moved in the directions A and B alternately through the wire 43, supporting shafts 41a and 41b and the connecting plates 33 and 34. There is disposed a spring 44 between the wire 43 and the supporting shaft 41a which corresponds to the return operation so as either to absorb a sudden change of a load at the returning operation and to stabilize the tension of the wire.

It is noted that the deceleration mechanism formed by the timing belt 48 and the timing pulley 46 is employed in order to prevent an unstable operation caused by back rush of a gear mechanism when the gear mechanism is employed between the pulse motor 49 and the supporting shafts 41a and 41b.

Figure 16:
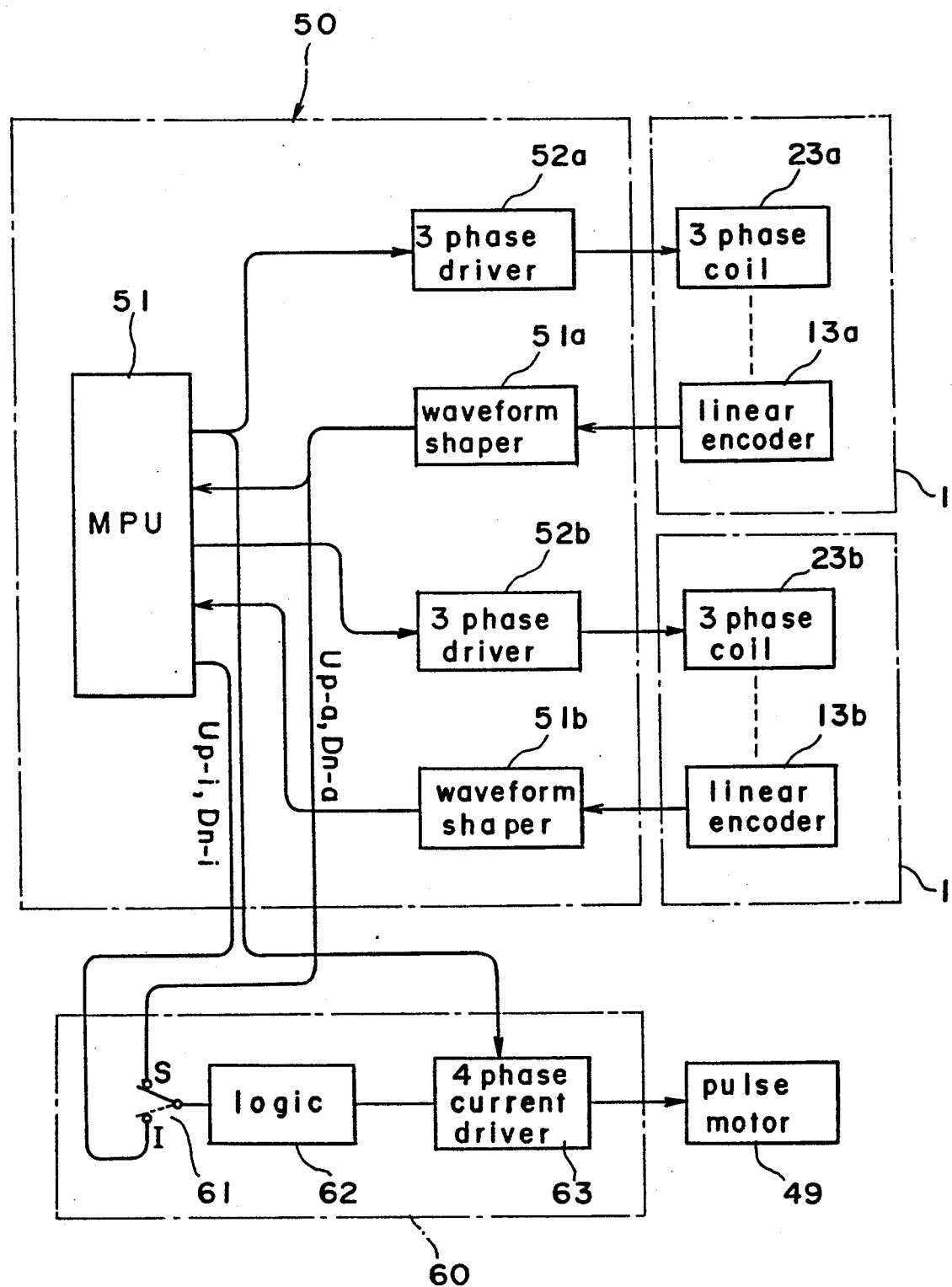
FIG. 16 is a circuit diagram showing the control device used in the embodiment shown in FIG. 13.

Referring to FIG. 16, showing the control device of the linear driving device of the present embodiment, in which the portion 50 has the same arrangement as mentioned already, a pulse motor driving circuit 60 comprises a switch 61 for switching the count up pulse signal Up-a and count down signal Dn-a fed from the linear motor control circuit 50 and further for switching the initializing signals Up-i and Dn-i, a logic unit 62 for processing the input signal fed through the switch 61 and a four phase current driver circuit 63 for supplying the four phase current produced corresponding to the processed input signals to the four phase pulse motor 49, whereby the pulse motor driving circuit 60 outputs the currents for driving the pulse motor 49 in a micro step manner (2W1-2 phase drive or vernier drive) in which the pulse motor 49 is driven by ¼ angle of the step angle of the pulse motor 49. By the micro step driving, the pulse motor 49 can be driven smoothly and the driving frequency characteristic is improved.

Upon supplying the power, the switch 61 is switched toward the I side, and when the first movable member 10a and the second movable member 10b are in the correct home position, non of signals are given from the MPU 51, thereby inhibiting the movement of both of the magnetic field forming members 30a and 30b. If the movable members 10a and/or 10b are not situated in the correct home position and are retracted to the correct home position by a suitable operation, the initializing signal Up-i and Dn-i are applied to the circuit 60 from the MPU51 the pulse motor 49 is driven by the signal from the circuit 60 to retract the magnetic field forming members to the correct home position. Upon completion of the initializing mentioned above, the switch 61 is automatically changed to the s side. Therefore, if the linear motors a and/or b are moved, the count up signal Up-a or count down signal Dn-a each of which represents the position of the movable members 10a is supplied to the circuit 60 through the switch 61. Thus the pulse motor 49 is driven by the output current from the four phase current driver 63 and the magnetic field forming member 30a is moved along with the first movable member 10a. The same operation is performed for the second movable member 10b and the magnetic field forming member 30b.

It is noted that the load on the MPU 51 can be decreased by employing the arrangement to control the pulse motor driving circuit 60 by the count up pulse signal Up-a and the count down pulse signal Dn-a.

The output of the three phase driver 52a represents the respective acceleration motion, deceleration motion, constant speed motion and of the first movable member 10a, and yet the respective motions are switched by the signal PS-a fed from MPU 51. The signal PS-a is also fed to the four phase driver 63, which is operated in the same manner as the motion of the three phase driver 52a, whereby the phase current of the pulse motor 49 does not affect to the electric angle of the fields of the pulse motor. In other words, during the constant speed motion and waiting in which no load is applied to the pulse motor, the phase current of the pulse motor can be decreased without badly affecting the electric angle, so that generation of heat from the pulse motor can be prevented.

Figure 17A:
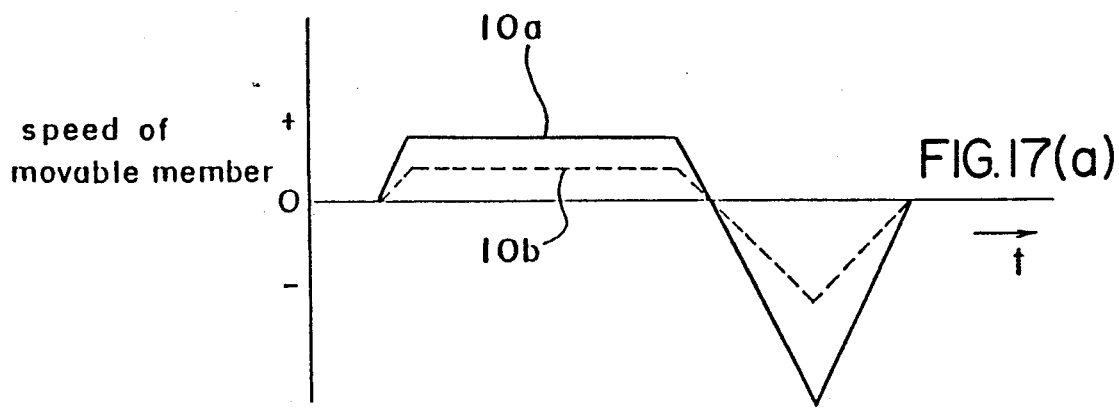
FIG. 17(a) is a graph showing the speed of movable members 10a and 10b versus time for the embodiment of FIG. 13.
Figure 17B:
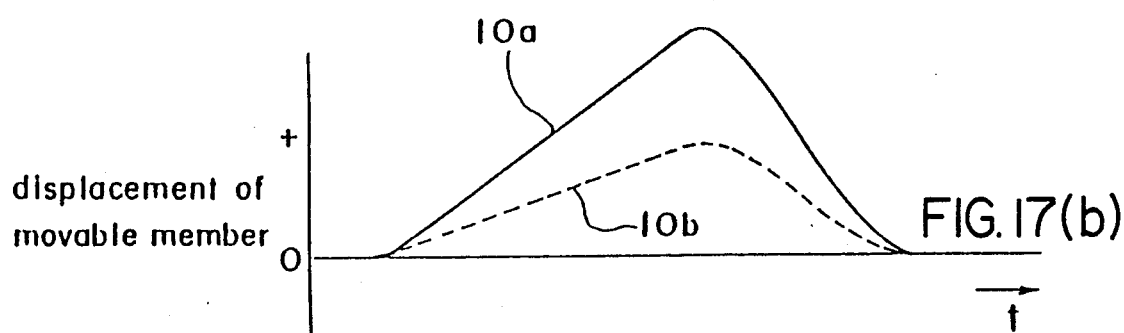
FIG. 17(b) is a graph showing the speed of movable members 10a and 10b versus time for the embodiment of FIG. 13.
Figure 17C:
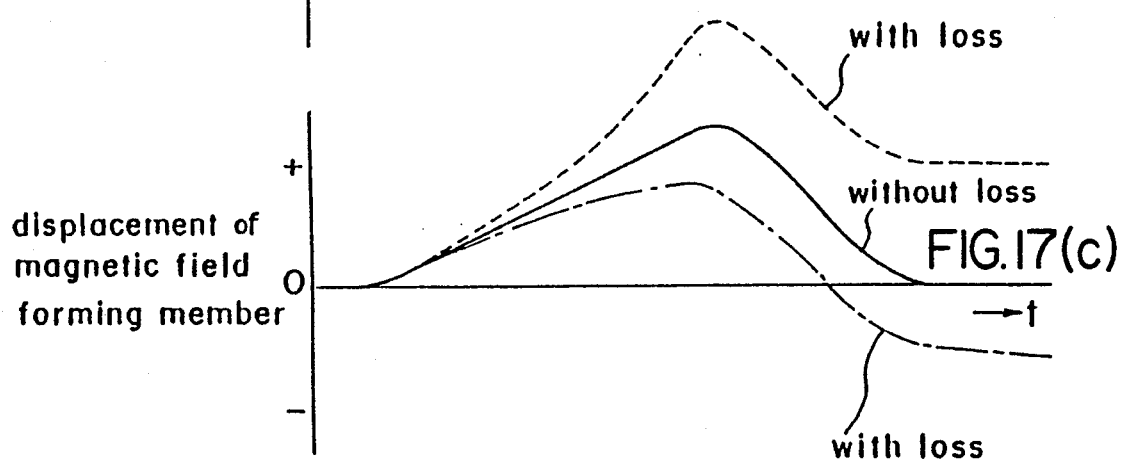
FIG. 17(c) is a graph showing the displacement of a magnetic field forming member versus time with and without losses for the FIG. 13 embodiment.—.

In the linear motor device arranged as mentioned above, the first movable member 10a and the second movable member 10b are speed controlled by the patterns shown in Fig. 17(a). Since the operation of the linear motors a and b and its effect of preventing vibration of the base frame and the transmission of vibration are similar to those in the embodiment shown in FIGS. 8 to 12.

In the retraction of the movable members 10a and 10b, in a case where the friction load loss is large or the attitude of the linear motor relative to the scanning direction is not horizontal, the displacement between the members 30a and 30b becomes large as the moving length of the members 30a and 30b increase due to the effect of the force of the self weight thereof in the component of the moving direction of the movable members 10a and 10b and the magnetic field forming members 30a and 30b.

Such displacement can be eliminated by the operation of the pulse motor by moving the magnetic field forming members 30a and 30b in the direction to eliminate the displacement.

Namely, the pulse motor 49 is driven by the count up pulse signal Up-a and count down signal Dn-a in the same condition that the magnetic field forming members 30a and 30b are placed in such a manner that the pulley 45 is rotated without loss. The displacement between the magnetic field forming members 30a and 30b is related to each mass of the first and second movable members 10a and 10b and each mass of the magnetic field forming members 30a and 30b.

Since the pulse motor is driven in the manner as mentioned above, when the loss is negligible, the electric angle of the field of the pulse motor and the rotation angle of the rotor of the pulse motor through the wire 43 and the pulley 46 can change with the same angle. On the other hand, when there occurs a difference of the displacement between the magnetic field forming members 30a and 30b if the loss becomes large, a rotary force for canceling the difference occurs at the rotor of the pulse motor and the rotary force is transmitted as the recovering force to the magnetic field forming members 30a and 30b. This means that the magnetic field forming members 30a and 30b can move in a condition which there is no loss even though in fact there is loss, therefore, the magnetic field forming members can be retracted to the correct home position.

The linear motor device shown in the present embodiment may be employed not only in the copying machine but in other various device such as magnetic disk drive or the like.

In addition in place of using the pulse motor, the retracting unit may be formed using a servo control device in which there are prepared a first positional signal showing the position of the magnetic field forming members 30a and 30b and a second positional signal showing the magnetic field forming members 30a and 30b, so that a servo control system is arrange by using the first signal as the reference signal and the second signal as the feed back signal.

A further embodiment of the linear motor apparatus according to the present invention is explained. This embodiment refers to the case where the present invention is applied to a scanning exposure type copying machine.

Figure 20:
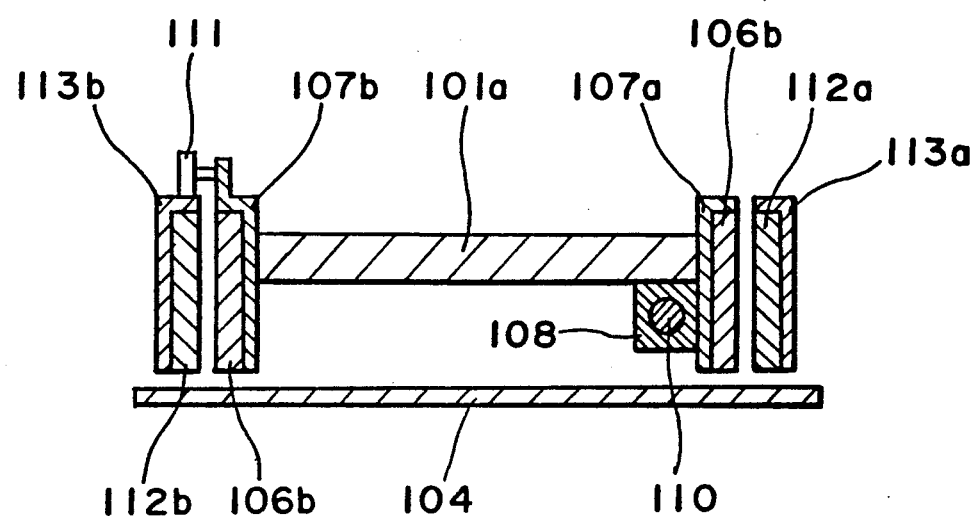
FIG. 20 is a sectional view taken along the line X4—X4 in FIG. 19.

As shown in each of FIG. 18 to FIG. 20, the linear motor apparatus 100 comprises a base frame 104 fixed inside the scanning exposure type copying machine body, a magnetic field forming member 103 constituted to be relatively linearly movable with respect to the base frame 104, and a movable member constituted to move relatively linearly with respect to the magnetic field forming member 103 and the base frame 104, respectively.

This movable member includes the moving unit 102 and the movable element 101, respectively.

Figure 22:
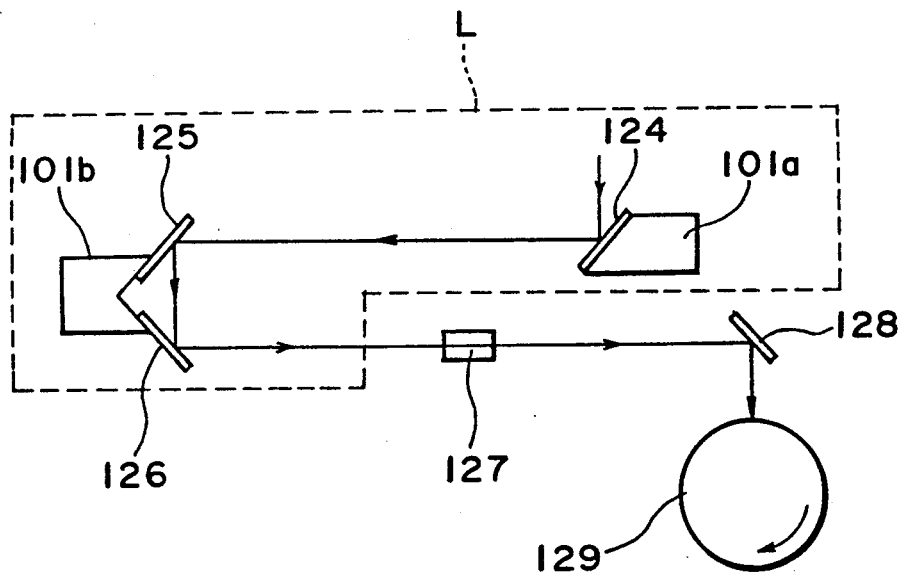
FIG. 22 is an illustrative view of the optical system of the scanning exposure copying machine to which the linear driving apparatus according to the present invention is applied.

The movable element 101 is constituted to permit accommodation of an optical unit L as shown in FIG. 22.

Further, the movable element 101 is constituted by the first movable element 101a and the second movable element 101b, as shown in FIG. 18 and FIG. 19, respectively.

The first movable member 101a has an elongated, flat shape. This first movable element 101a is equipped with a first mirror 124 and a lamp unit (not illustrated), etc.

The second movable member 101b has an elongated, flat shape, as in the first movable member 1a.

This second movable element 101b is equipped with a second mirror 125 and a third mirror 126.

To these first mirror 124, second mirror 125, third mirror 126, respectively, a lens 127 disposed to have an inverted image formed of the light sent through the first mirror 124 to the third mirror 126 respectively, a fourth mirror 128 disposed between said lens 127 and the sensitive drum 129 to reflect the light from said lens 127 on the sensitive drum 129 is added to constitute an optical system of the copying machine.

The moving unit 102 has a movable yoke 107a and a movable yoke 107b which are fixed respectively to the end 130a and the end 130b on the two sides of the first movable element 101a , and a movable yoke 107c and a movable yoke 107d which are fixed respectively to the end 30c and the end 130d on the two sides of the second movable element 101b, respectively.

Each of the movable yokes is furnished with three coils of coil 106a, coil 106b, and coil 106c.

Each of these movable yokes constitutes a course for passing the magnetic fluxes generated from the corresponding three coils.

Further, the movable element 1a and the movable element 1b have the bearings 108 which are fitted to the movable yoke 107a and the movable yoke 107c, respectively. The bearing 108 is freely slidably supported on the shaft 110.

The shaft 110, thrusting through the connecting plate 114a and the connecting plate 14b respectively which mutually connect the fixed yoke 113a and the fixed yoke 113b which constitute the later described magnetic field forming member 103, is fixed to the fixed yoke 113a and the fixed yoke 113b, respectively, supported by the holder 115a and the holder 115b, respectively.

The moving unit 102 has rollers 111 mounted on the movable yoke 107b and the movable yoke 107d, respectively.

The roller 111 is supported on the fixed yoke 113b of the magnetic field forming member 103.

Figure 23:
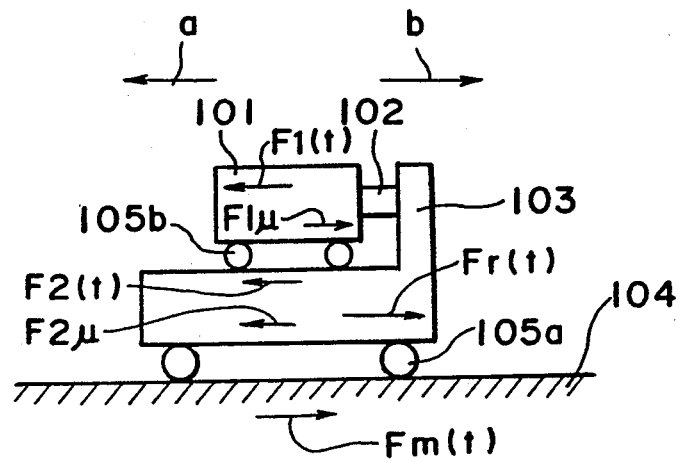
FIG. 23 is a schematic illustrative view of the operating principle of the linear motor apparatus according to the present invention.

By the bearings 108 which are freely slidably supported on the rollers 111 and the shaft 110, there is constituted a moving means 105b which can relatively linearly movable with respect to the magnetic field forming member 103 of said movable element 101 provided between the magnetic field forming member 103 and the movable element 101 as schematically shown in FIG. 23.

The magnetic field forming member 103 has the permanent magnets 112a and 112b which are multipolarly magnetized so as to correspond to each row of the aforementioned 103 coil rows and the fixing yokes 113a and 113b for linearly arranging to fix the permanent magnets 112a and 112b, respectively.

Each of these permanent magnets 112a and 112b is disposed at a prescribed space to the 103 coils so as to constitute a three phase brushless motor in collaboration with the above mentioned three coil rows.

Also, the fixing yokes 113a and 113b are connected by the connecting plates 114a and 114b at the respective two ends and integrally formed as a frame 114.

Between the base frame 104 and the magnetic field forming member 103, there is provided a moving means 105a (FIG. 23) which permits movement of the magnetic field forming member 103 with respect to the directions of the arrow a and the arrow b.

The moving means 105a is constituted by a pair of shafts 109a and 109b which are fixed to the base frame 104 which constitutes a part of the magnetic field forming member 103 and a pair of rollers 16a and 16b which are fixed to the fixing yoke 113b which constitutes a part of the magnetic field forming member 103.

The bearings 109a and 109b are constituted to support the shaft 110 freely slidably.

In the operating state of the linear motor apparatus constituted as above, each of the coil members 106a, 106b and 106c may generate a drive force for the linear movement by the selection of the excitation by the hole element (not illustrated) which may be provided for example on the movable yokes 101a and 101b fixed to the first movable member 101a and the movable yokes 107c and 107d fixed to the second movable member 101b.

Further, the first movable member 101a and the second movable member 101b is preferably operated synchronously in order to keep optical channel length constant.

Figure 21:
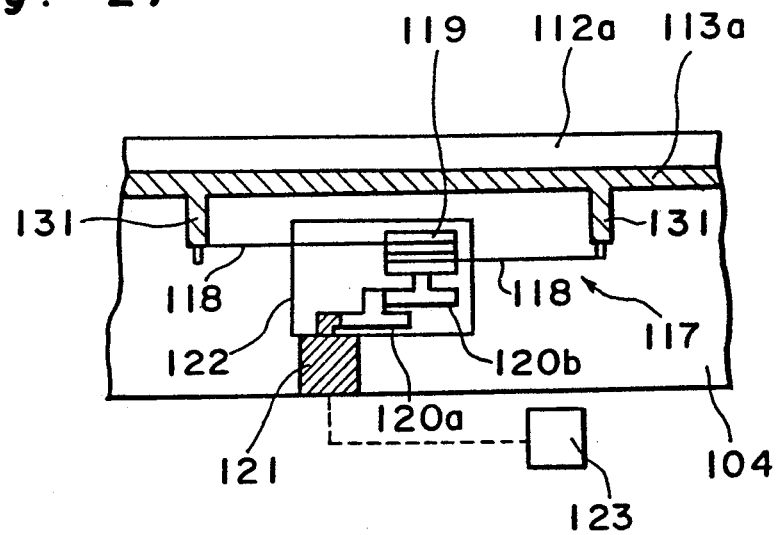
FIG. 21 is a partially enlarged plan view of an embodiment of the linear driving apparatus shown in FIG. 19.

The aforementioned return movement means 117 for returning the magnetic field forming member 103 to the initial position as shown in FIGS. 18 and 19 is shown in magnification specially in FIG. 21.

That is to say, the return movement means 117 comprises a frame 122 fixedly fitted to the base frame 104, a pulse motor 121 mounted on the frame 122, a control apparatus 123 which is connected with the pulse motor 121 to control the operation of the pulse motor 121, a first gear 120a which is rotated by the rotary drive force of the pulse motor 121, a second gear 120b which is rotated by the rotation of the first gear 120a, a pulley 119 which is rotated by the rotation of the second gear 120b, and wires 118 which are connected with the respective two projecting members 131 provided integrally with the fixed yoke 113a which constitutes the magnetic field forming member 103.

In the return movement means 117 constituted as above, when a driving force is formed by rotation by the operation of the pulse motor 121, each of the second gear 120b and the pulley 119 rotates corresponding to the respective direction of the rotation.

As a result, the wire 118 moves in the direction of either the arrow a or arrow b corresponding to the direction of said rotation, and accordingly the magnetic field forming member 103 including the fixed yoke 113a can be moved in either direction of the arrow a or arrow b.

From the above sequences it will by understood that the direction of the return of the magnetic field forming member 103 to the initial position can be selected to any direction.

Next, the state of the case where the linear motor apparatus 100 is operated according to the present embodiment is explained.

By supplying current to the three coils fitted to each of the movable yokes 107a, 107c and 107d in the moving unit 102, i.e., the coils 106a, 106b and 106c , to have them generate the magnetic fluxes, a steering force is generated on the moving unit 102.

When a steering force is generated on each moving unit 102, each of the movable members 101a and 101b which are integrated with the moving unit 102 moves in the scanning direction along with the moving unit 102, e.g., the direction of the arrow a as shown in FIG. 18.

When each of the movable members 101a and 101b moves in the direction of the arrow a, each of the permanent magnets 112a and 112b of the magnetic field forming member which are disposed at a prescribed space against the row of the above mentioned three coils generates a repulsive force in the direction shown in the arrow b reverse to the arrow a.

However, as the magnetic field forming member 103 has a moving means 105a which enables the magnetic field forming member 103 to move with respect to the direction of the arrow a or the arrow b between the base frame 104, even if for example a repelling force in the direction shown in the arrow b is formed, the said member can absorb the repelling force by moving in the direction of the arrow b.

Further, when the moving unit 101 and 102, on completion of the movements in the scanning direction as shown by the arrow a, returns to the original position, i.e., moves in the return direction as shown by the arrow b, each of the permanent magnets 112a and 112b of the magnetic field forming member 3 generates the repelling force in the direction as shown by the arrow a reverse to the direction as shown by arrow b. The magnetic field forming member 103 can absorb the repelling force by moving in the direction of the arrow a by the moving means 105a in the same manner as aforementioned.

However, owing to the friction load and the like, the magnetic field forming member 103 cannot return strictly to the original waiting position, i.e., exact initial position.

Accordingly, it is necessary to have the magnetic field forming member 103 move to the accurate initial position by the aforementioned return moving means 117.

Here, in the linear motor apparatus 100 of the present embodiment, assuming the weight of the movable member 101a to be F1a, the weight of the movable member 101b to be F1b, the weight of the magnetic field forming member 103 to be F2, and the friction coefficient to be $\mu$, the friction load formed between the movable member 1a and the magnetic field forming member 103 becomes F1a $\mu$, the friction load formed between the movable member 101b and the magnetic field forming member 103 becomes F1b $\mu$, and the friction load formed between the magnetic field forming member 103 and the base frame 104 becomes F2 $\mu$.

Further, assuming the scanning direction to be a positive direction and shown by the arrow a, the acceleration force of the movable member 1a to be F1a(t), the steering force to be generated on the movable member 1b to be F2b(t), the acceleration force of the magnetic field forming member 103 to be Fm(t), and the repelling force to be generated on the magnetic field forming member 103 to be Fr(t), the acceleration force Fm(t) of the magnetic field forming member 103 becomes:

$$F1a(t) = F2a(t) - F1a \mu$$

$$F1b(t) = F2b(t) - F1b \mu$$

$$Fr(t) = -F2a(t) - F2b(t)$$

$$Fm(t) = Fr(t) + F1a \mu + f1b + F2 \mu$$

$$\therefore Fm(t) = -F1a(t) - F1(t) + F2 \mu.$$

Accordingly, it can be concluded from the above that, because the movable members 101a and 101b are constructed as being freely linearly movable on the magnetic field forming member 103, the effects of the friction load F1a $\mu$ of the movable member 1a and the friction load F1b $\mu$ of the movable member 101b can be offset, and as a result the acceleration force Fm(t) of the magnetic field forming member 103 can be reduced, so that the load to be exerted to the aforementioned return movement means 117 can be reduced.

Figure 24:
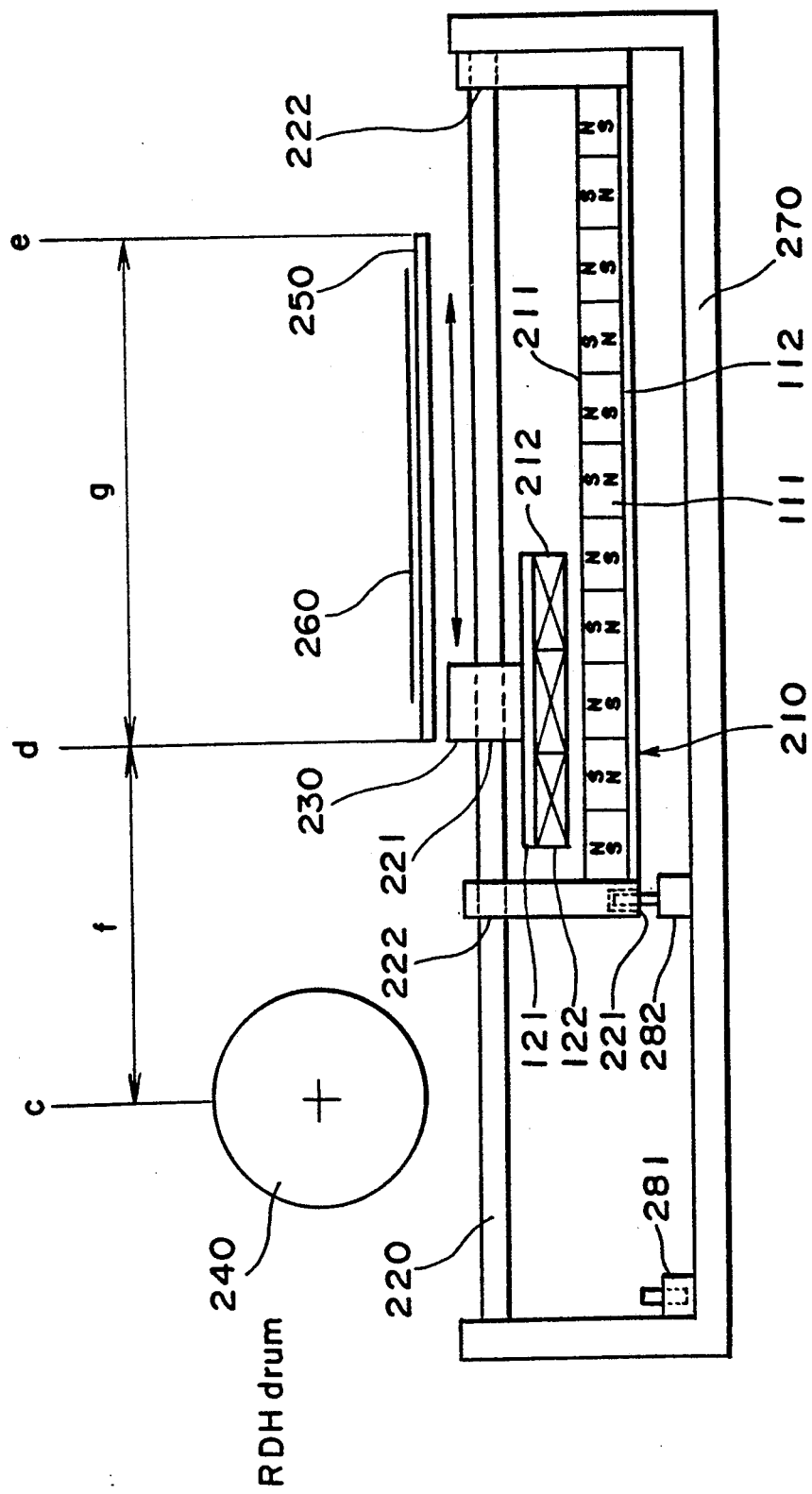
FIG. 24 is a side view of a further embodiment of the linear driving apparatus used in a copying machine under the condition that an original document is placed on an original document placing platform.
Figure 25:
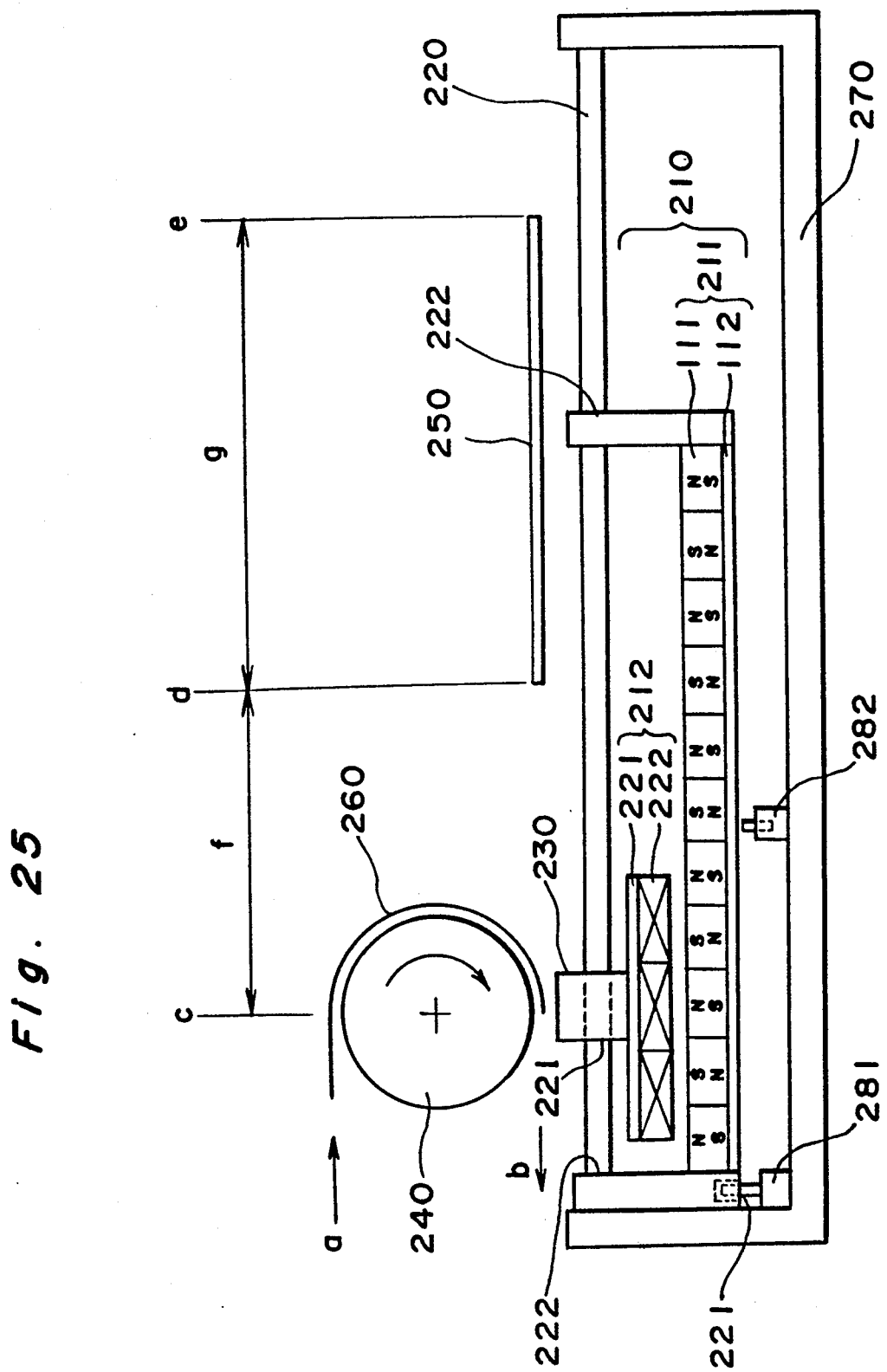
FIG. 25 is a side view of the copying machine under the condition that an original document is involved on a surface of a recirculating document handler drum.
Figure 26:
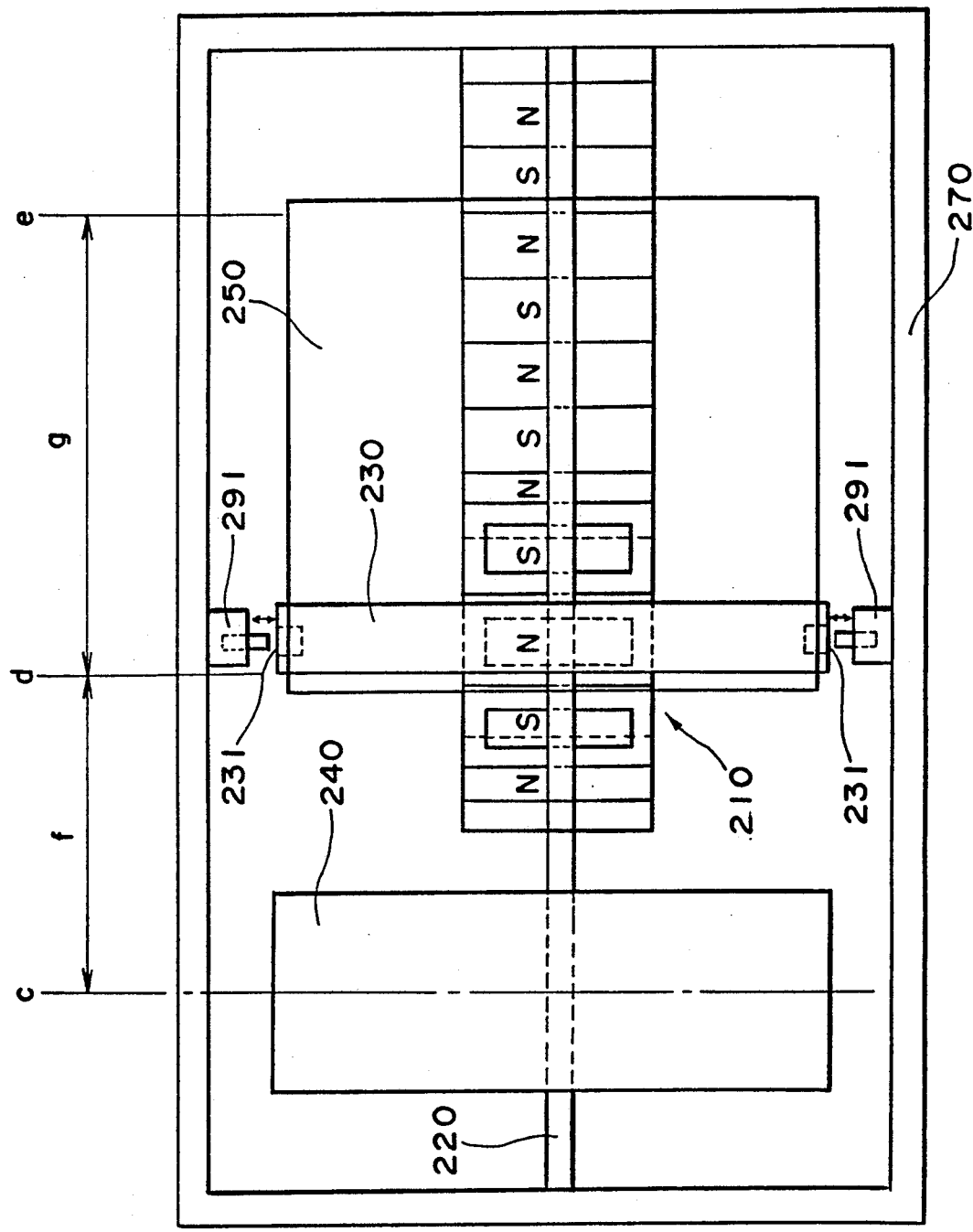
FIG. 26 is a plan view of the copying machine.

A further embodiment of a linear driving device for use in a copying machine according to the present invention will be explained with reference to FIGS. 24 to 26. FIG. 24 is a side plan view of a copying machine under the condition that an original document is placed on an original document placing platform and FIG. 25 is a side plan view of the copying machine under the condition that an original document is involved on a surface of a recirculating document handler drum (referred to as RDH drum hereinafter). FIG. 26 is a plan view of the copying machine.

A schematic constitution of the copying machine using a linear driving device according to the present invention is explained with reference to FIGS. 24 and 25.

Reference numeral 270 denotes a base frame of the copying machine. There is provided a transparent original document placing platform 250 for placing an original document 260 above the base frame 270. There is also provided a RDH drum 240 connected to a motor (not shown) in a left front portion of the original document placing platform 250 above the base frame 270. The copying machine mentioned above has such a basic structure that the same content as that of the original document 260 can be copied by placing the original document 260 on the original document placing platform 250 as shown in FIG. 24 or by involving the original document 260 on the RDH drum 240 in a direction a as shown in FIG. 25. In the latter case as shown in FIG. 25, the original document 260 inserted in the direction a is wound up by the RDH drum 240 and then discharged in a direction b.

With more detailed description, reference numeral 230 denotes an original document reading unit for reading the contents of the original document 260, which is a part of a movable portion to be linearly slidden. The original document reading unit 230 is comprised of CCD or optical filters aligned in a line shape in a frontward direction of a sheet. There is also provided a bearing 221 mounted on a guide member 220 corresponding to the first and second guide members of a shaft, with the right and left edge portions of the guide member 220 fixed to the right and left side walls of the base frame 270. In other words, the original document reading unit 230 is slidably moved along the guide member 20. Moreover, in the both end portions in the longitudinal directions of the original document reading unit 230, there are formed a pair of engagement holes 231 for engaging with rod portions of a pair of solenoids 291 respectively fixed to both of the inside surfaces of the front and rear side walls of the base frame 270 as shown in FIG. 26.

The original document reading unit 230 is so arranged as to be linearly driven between a transfer region f and a linear scanning region g alternately by a linear motor 210 to be explained as following.

The transfer region f is defined as a linear shifting region between a position c just below the longitudinal center line of the RDH drum 240 and a position d just below the left edge of the original document placing platform 260. The linear scanning region g is defined as a linear shifting region between the position c and a position e just below the right edge of the original document placing platform 60.

The linear motor 210 comprises magnetic field forming member 211 having a plurality of permanent magnets 111 with their N and S poles alternately arranged on the upper surface of a fixing plate 112 and a movable member 212 having a three phase coil 122 fixed to the under surface of the movable plate 121.

The movable member 212 is fixed to the bottom portion of the original document reading unit 30. On the contrary, the magnetic field forming member 211 is slidably moved in parallel to the sliding direction of the movable member 212. That is to say, the right and left side portions of the magnetic field forming member 211 are fixed to lower inside portions of a pair of bearings 222 which are slidably engaged with the guide member 220, so that the magnetic field forming member 211 is slidably shifted along the guide member 220 via the bearings 222. In the lower portion of the left side bearing 222, there is formed a hole 221 for engaging with rod portions of the solenoids 281 and 282 provided at predetermined positions on the bottom surface of the base frame 270. The solenoids 281 and 282 are to be described later.

The length of the magnetic field forming member 211 is set in accordance with the distance of the linear scanning region g and is made much shorter than the length of the guide member 220, in a range of generally 2 to 3 thereof.

The operation of the copying machine constituted as described above is explained with reference to FIGS. 24 and 25.

When the copying operation is carried out with the original document 260 placed on the original document placing platform 250, the magnetic field forming member 211 is situated and fixed in the right side position as shown in FIG. 24 by operating the solenoid 282 in such a manner that the top portion of the rod of the solenoid 282 is inserted in the hole 221 defined in the lower portion of the bearing 222. In this case, the position of the original document reading unit 230 is initially set to the position d.

In this state, the linear motor 210 is driven. That is to say, under the condition that the magnetic fluxes formed by the magnetic field forming member 211 are complicated, when there is applied desirable exciting current to the three phase coil 122 of the movable member 212, a driving force is applied to the movable member 212, whereby the original document reading unit 230 is linearly shifted in the range of the linear scanning region g between the position d and the position e alternately. In this operating process, the contents of the original document 260 placed on the original document placing platform 250 are read.

Next, when the copying operation is performed by inserting the original document 260 in the direction a so as to be involved on the surface of the RDH drum 240, while the rod of the solenoid 282 inserted in the hole 221 is pulled back from the hole 221 so as to release the lock of the magnetic field forming member 211, the rods of the solenoids 291 are inserted in the holes 231 so as to lock the original document reading unit 230 and the movable member 212 with the front and rear side walls of the base frame 270. Under this condition, when the linear motor 210 is driven, since the movable member 212 is engaged with the base frame although a drive force is applied to the movable member 212, only the magnetic field forming member 211 is shifted to the left side position along the guide member 220 due to the reaction of the drive force. When the left bearing 222 fixed to the magnetic field forming member 211 is abutted to the inner surface of the left side wall of the base frame 270, the linear motor 210 is stopped and then the rod of the solenoid 281 is inserted in the hole 221 defined in the lower portion of the left side bearing 222 so that the magnetic field forming member 211 is locked with the bottom wall of the base frame 270. Then the rods of the solenoids 291 are pulled back from the holes 231 so as to release the lock of the original document reading unit 230 and the movable member 212 from the front and rear side walls of the base frame 270, thereafter the linear motor 210 is so driven that the original document reading unit 230 is shifted back to the position c from the position d. Under this condition, the original document 260 is inserted in the direction a to be involved on the RDH drum 240 by rotating the RDH drum 240, whereby the contents of the original document 260 are read by means of the original document reading unit 230 in the process of feeding out the original document 260 in the direction b.

When the copying operation is performed again under the condition that the original document 260 is placed on the original document placing platform 250, the operation is performed just in the opposite manner.

According to the embodiment of the copying machine using the linear driving device of the present invention, there can be obtained such merits as follows.

First, in spite that the original document reading unit 230 can be linearly shifted in the range of the transfer region f and linear scanning region e along the guide member 220, there can be employed a magnetic field forming member 211 with its length shorter than the shifting distance f and g between the positions c and e of the original document reading unit 230. This means that a linear motor 210 of a low price is available.

Moreover, since the magnetic field forming member 211 is linearly moved along the guide member 220, it is not required to use an exclusive guide member and there can be used a conventional mechanism, and therefore, the total cost of the copying apparatus can be lowered.

Furthermore, in the linear driving operation of the magnetic field forming member 211, since the drive force of the linear motor 210 is used, it is not necessary to provide a new driving source, thereby reducing the cost.

Accordingly, there is a significant merit for increment of the ability of the copying machine and for reducing the cost of the copying apparatus as a whole.

A still further embodiment of the linear driving apparatus according to the present invention is explained with reference to the drawings.

Figure 27:
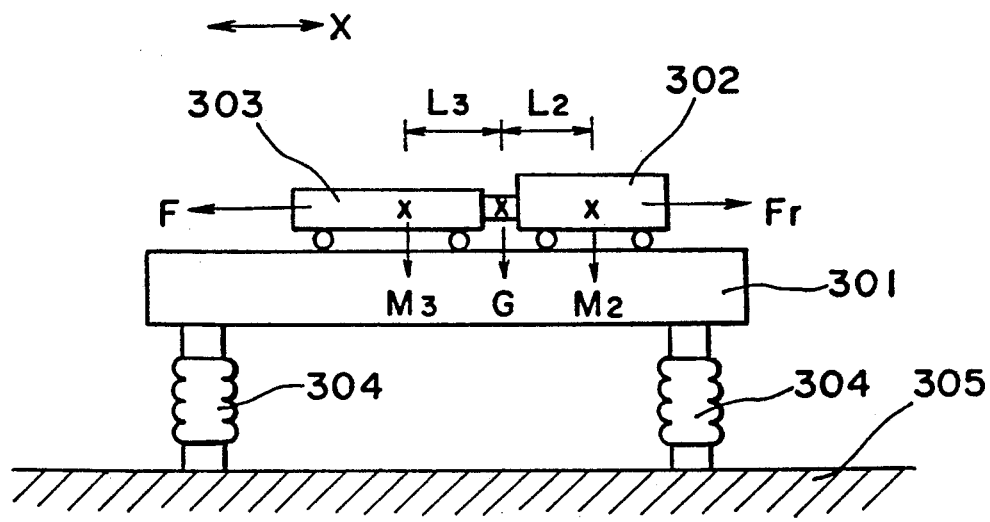
FIG. 27 is a schematic view of a further embodiment of the linear driving apparatus showing an initial condition.
Figure 28:
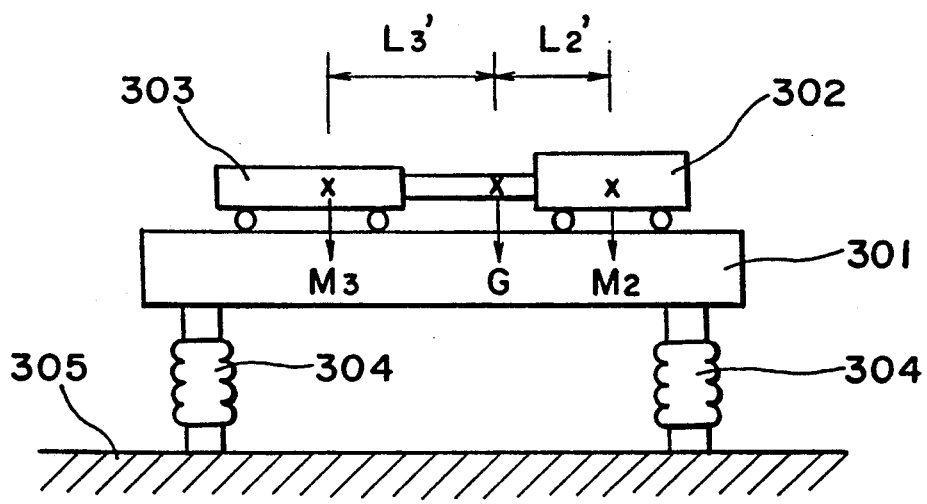
FIG. 28 is a schematic view corresponding to FIG. 27 showing a condition after the operation.

The linear driving apparatus shown here is a linear motor for X-Y stage for exposing light to wafers. FIG. 27 and FIG. 28 are the views which show schematically the constructions required for moving the wafer (not illustrated) in the direction X. In the drawing, the construction required for moving in the direction Y is omitted from illustration.

In the drawing, the part 301 is rectangular vibration eliminating table. On the lateral periphery of the reverse side of the vibration eliminating table 301 there are provided a plurality (in the example shown in the embodiment, four) of the pneumatic spring vibration eliminating member 304. By means of the vibration absorbing member 304, the vibration from the floor surface 305 is absorbed so as not to be transmitted to the vibration eliminating table 301.

On the vibration eliminating table 301 there are provided both the movable element 303 and the magnetic field forming member 302, which are the major constructions of the linear motor.

The movable element 303 has a construction wherein a multi-phase coil is fixed to a yoke, and is freely linearly movably disposed in the direction of X by a guide shaft (not illustrated), and on the other hand the magnetic field forming member 302 has a structure in which the permanent magnet is magnetized alternately as N-pole and S-pole on a stator yoke (not illustrated), and it is likewise freely linearly movable in the direction X by a separate guide structure.

In the linear driving apparatus, when a prescribed exciting current is supplied to the movable member 303 under the state where the magnetic fluxes from the magnetic field forming member 302 are crossed, a steering force F is to be exerted to the moving unit 303, by which the object to be moved which is connected to the moving unit 303 is moved in the direction of X. The construction to move the object to be moved in the direction of Y (direction to this side in the drawing) is also similar to the above. The basic construction is such that the object to be moved is subjected to the position setting control in the X-Y plane under regulation of the exciting current to be supplied to the moving unit 303.

In the linear driving apparatus constructed as above, against whatever movement of the object to be moved, no vibration occurs on the vibration eliminating table 301, and yet no change occurs on the position of the center of gravity thereof. The principle of this system is explained in detail with reference to FIG. 27 and FIG. 28 hereinafter.

FIG. 27 shows an initial condition of the moving unit 303. Here, it is assumed that the mass of the moving unit 303 including the object to be moved is $M_3$, the mass of the magnetic field forming member 302 is $M_2$, and the position of the center of gravity including these two is G. Also, assuming that the distance between the position of the center of gravity of the moving unit 303 and the position of the center of gravity G is $L_3$, and the distance between the position of the center of gravity of the magnetic field forming member 302 and the position of the center of gravity G is $L_2$, the following relative expression is formulated.

$$M_2 \cdot L_2 = M_3 \cdot L_3 \qquad (1)$$

When a prescribed exciting current is supplied to the multi-phase coil of the movable element 303 under this condition, a steering force F is exerted to the moving unit 303, by which the object to be moved is moved in the steering direction (direction X) along with the moving unit 303.

FIG. 28 shows a condition of the moving unit 303 after the operation.

With the above movement of the moving unit 303, as a reactive effect of the steering force F, a reaction force Fr is exerted to the magnetic field forming member 302, by which the magnetic field forming member 302 moves in the direction of the anti-steering force (direction X). Accordingly, no reactive force Fr is transmitted to the vibration eliminating table 301, so that no vibration occurs on the vibration eliminating table 301.

Further, detailed explanation is given on the process of the movements of the moving unit 303 and the magnetic field forming member 302. First, the movement amount of the moving unit 303 when the steering force to be acted on the moving unit 303 is F(t) is assumed to be $\Delta x_3$ Then, the reaction force to be exerted to the magnetic field forming member 302 becomes $$Fr(t) = -F(t) \qquad (2)$$

By this, the magnetic field forming member 302 moves in the direction of anti-steering force by $\Delta x_2$.

Here, in an ideal condition where there is no loss of friction load or the like, the following relative expressions are formulated:

$$\Delta x_3 = \int\int F(t)/M_3 dt^2 \qquad (3)$$

$$\Delta x_2 = \int\int Fr(t)/M_2 dt^2 \qquad (4)$$

To modify the equation (4) by using the equation (3):

$$\Delta x_2 = -(M_3/M_2) \cdot \Delta x_3 \qquad (5)$$

On the other hand, assuming the moving distances of the movable element 301 and the magnetic field forming member 302 to the initial center of gravity position G to be $L_2'$ and $L_3'$, respectively, the following relative expressions are formulated:

$$L_2' = L_2 + |\Delta x_2| \qquad (6)$$

$$L_3' = L_3 + |\Delta x_3| \qquad (7)$$

Accordingly, the rotation moment $NM_3$ of the movable element 3 to the center of gravity position G becomes, using the equation (7):

$$MM_3 = M_3 \cdot L_3' = M_3 \cdot L_3 + M_3 |\Delta x_3| \qquad (8)$$

On the other hand, the rotation moment $MM_2$ of the magnetic field forming member 302 to the center of gravity position G becomes, using the equations (6) and (5):

$$\begin{aligned} MM_2 &= M_2 \cdot L_2' \\ &= M_2(L_2 + |\Delta x_2|) \\ &= M_2 \cdot L_2 + M_2|-(M_3/M_2) \cdot \Delta x_3| \\ &= M_2 \cdot L_2 + M_3|-\Delta x_3|. \end{aligned} \qquad (9)$$

Accordingly, from the equations (8), (9) and (1), the relation becomes $MM_3 = MM_2$, whereby it is demonstrated that the position of the center of gravity G after the movements of the moving unit 303 and the magnetic field forming member 2 does not change from that in the initial condition. Unless there is no change in the position of the center of gravity G, naturally no change occurs on the position of the center of gravity of the vibration eliminating table 301. Although this explanation with respect to the position of the center of gravity is based on the premise of an ideal condition having no loss such as the friction load, if there is adopted a structure to minimize the loss such as manual load as far as possible, no significant change occurs on the position of the center of gravity of the vibration eliminating table 1 even when the object to be moved moves with the moving unit 303.

When the linear driving apparatus as stated above is adopted, however the object to be moved is moved in the X-Y plane, no vibration occurs on the vibration eliminating table 1 and no undesirable result such as an inclination of the vibration eliminating table 301 occurs. Therefore, this is very largely significant in elevating the precision of the position setting control of the linear driving apparatus. Especially, this has particularly large merit when the object to be driven is subjected to high acceleration movement or when the apparatus is of a large size.

With respect to the linear driving apparatus according to the present invention, any kind of one may be applicable if it has a vibration eliminating table. Further, any vibration eliminating table may be used if it has a structure to be kept horizontal.

What is claimed is:

1. A linear driving apparatus comprising:
   at least one moving unit provided to move linearly on a base fram;
   magnetic field forming members opposed to each one of the moving units; and
   moving means provided on said magnetic forming members for moving a magnetic forming member on the base frame by reaction force occurring when at least one moving unit is driven, so that when at least one moving unit moves in a first direction the magnetic forming members will move in a second direction which is opposite to said first direction.

2. The linear driving apparatus according to claim 1, wherein said apparatus further comprises retraction means for retracting said magnetic field forming members to a home position.

3. A linear driving apparatus comprising:
   one or more moving units provided to move linearly on a base frame;
   one or more magnetic field forming members opposed to each of the moving units;
   moving means provided on said magnetic forming members for moving the magnetic forming members on the base frame by reaction force occurring when the moving units are driven; and
   retraction means for retracting said magnetic field forming members to a home position, said retracting means formed by a motor to move the magnetic field forming members in response to the signal representing the movement of the magnetic field forming members or moving unit said retracting means is formed by a motor to move the magnetic field forming members in response to the signal representing the movement of the magnetic field forming members or moving unit.

4. A linear driving apparatus comprising:
   a base frame;
   a magnetic field forming member movable linearly with respect to the base frame; and a movable member which5 is disposed on said magnetic field forming member and movable linearly with respect to the base frame by said magnetic field forming member; and
   means to absorb repelling force formed on said magnetic field forming member when said said movable member moves in linearly by action of said field forming member.

5. A linear driving apparatus in which a driving force created by magnetic fluxes of a magnetic field forming member is applied to a movable member so that a movable object is linearly moved alternately, comprising:
   first guide means for slidably shifting said movable member in the direction of said drive force;
   second guide means for slidably shifting said magnetic field forming member with its length shorter than the distance of the movement of said movable object in parallel with the direction of said drive force; and
   drive means for linearly driving said magnetic field forming member along said second guide means.

6. A linear driving apparatus for linearly driving an object comprising:
   a floor supported vibration eliminating table,
   means for absorbing vibration located between said table and floor;
   a movable element positioned on said table for driving an object by steering force applied to said movable element; and
   a magnetic field forming member for applying magnetic flux to said movable element said magnetic field forming member being freely movable in a linear and anti-steering force direction on said vibration eliminating table, so that no vibration occurs on said vibration eliminating table.

7. The linear driving apparatus according to claim 1, wherein the retraction means includes a spring.

8. The linear driving apparatus according to claim 1, wherein the retraction means includes a detector.

9. The linear driving apparatus according to claim 1, wherein there are a plurality of moving units.

10. The linear driving apparatus according to claim 9, wherein the moving units are movable independently of each other.

11. The linear driving apparatus according to claim 1, wherein said base frame includes a shaft connected to connecting plates.

12. The linear driving apparatus according to claim 1, wherein said at least one moving unit is an elongated plate.

* * * * *